United States Patent [19]

Iwamoto et al.

[11] Patent Number: 5,946,268
[45] Date of Patent: Aug. 31, 1999

[54] INTERNAL CLOCK SIGNAL GENERATION CIRCUIT INCLUDING DELAY LINE, AND SYNCHRONOUS TYPE SEMICONDUCTOR MEMORY DEVICE INCLUDING INTERNAL CLOCK SIGNAL

[75] Inventors: Hisashi Iwamoto; Yasumitsu Murai, both of Hyogo, Japan

[73] Assignees: Mitsubishi Denki Kabushiki Kaisha; Mitsubishi Electric Engineering Company Limited, both of Tokyo, Japan

[21] Appl. No.: 09/012,558

[22] Filed: Jan. 23, 1998

[30] Foreign Application Priority Data

Jun. 18, 1997 [JP] Japan .................................. 9-161048
Sep. 17, 1997 [JP] Japan .................................. 9-251842

[51] Int. Cl.$^6$ ........................................................ G11C 7/00
[52] U.S. Cl. ............................................. 365/233; 365/194
[58] Field of Search .................................. 365/194, 233, 365/220

[56] References Cited

U.S. PATENT DOCUMENTS 5,754,490  5/1998  Harrison et al. ......................... 365/194
5,768,177  6/1998  Sakuragi .................................. 365/194
5,805,511  9/1998  Manning .................................. 365/194

FOREIGN PATENT DOCUMENTS 05191234  7/1993  Japan .

OTHER PUBLICATIONS

Shoji, "*CMOS Digital Circuit Technology*", pp. 177–189.
1997 IEEE International Solid–State Circuits Conference (Abstract).

*Primary Examiner*—Vu A. Le
*Attorney, Agent, or Firm*—McDermott, Will & Emery

[57] ABSTRACT

An internal clock generation circuit includes a delay line in which a plurality of inverter circuits are connected in series. A switch and a capacitor are connected to an output node of each inverter circuit. The switch connected to each inverter circuit is turned on/off individually according to respective control signals. In response to the switch being turned on, the output node of a corresponding inverter circuit and the capacitor are connected, whereby the capacitance of the output node of the corresponding inverter circuit is altered. As a result, the transmission rate of the signal is altered.

14 Claims, 21 Drawing Sheets

INTERNAL CLOCK SIGNAL GENERATION CIRCUIT INCLUDING DELAY LINE, AND SYNCHRONOUS TYPE SEMICONDUCTOR MEMORY DEVICE INCLUDING INTERNAL CLOCK SIGNAL

BACKGROUND OF THE INVENTION

1. Field of the Invention

The present invention relates to an internal clock signal generation circuit and a synchronous type semiconductor memory device. More particularly, the present invention relates to an internal clock signal generation circuit that generates an internal clock signal synchronizing in phase with an external clock signal, and a synchronous type semiconductor memory device that accepts an external signal in synchronization with a clock signal provided periodically from an internal clock signal generation circuit.

2. Description of the Background Art

Although the operating speed of a dynamic access memory (referred to as DRAM hereinafter) employed as a main memory has been increased, it has not necessarily come to the level of the operating speed of a microprocessor (referred to as MPU hereinafter) yet.

Therefore, the performance of the entire system is degraded on account of the bottleneck of the access time and cycle time of the DRAM.

In recent years, a synchronous DRAM (referred to as SDRAM hereinafter) operating in synchronization with a clock signal is proposed as a main memory corresponding to a high speed MPU. Such an SDRAM will be described hereinafter.

Referring to FIG. 17, a conventional SDRAM 100 includes a clock buffer 101, a control signal buffer 102, an address buffer 103, a control circuit 104, a memory array 105, and an input/output buffer 106.

Memory array 105 includes a plurality of memory cells (not shown) connected in a matrix of rows and columns. Clock buffer 101 outputs a clock signal CLK for an internal operation according to an external clock signal ext.CLK. Control signal buffer 102 receives various control signals for driving control circuit 104 such as a /RAS signal (row address strobe signal), a /CAS signal (column address strobe signal), and a /WE signal (write enable signal). Address buffer 103 receives an address signal Add designating a memory cell to be selected from address pins A0–A10. Control circuit 104 renders a memory cell to a selected state in synchronization with clock signal CLK. Input/output buffer 106 responds to clock signal CLK to receive data to be written to the selected memory cell or output data read out from the selected memory cell via data input/output terminals DQ0–DQ7. SDRAM 100 inputs/outputs a byte of 8 bits from data input/output terminals DQ0–DQ7.

The operation of SDRAM 100 will be described hereinafter. In SDRAM 100, a (high speed access) specification is proposed for outputting or inputting data of a plurality of bits continuously from one data input/output terminal in synchronization with a system clock.

Referring to FIG. 18, SDRAM 100 receives an externally applied /RAS signal, /CAS signal, address signal Add, and the like at a rising edge of an external clock signal ext.CLK which is a system clock.

Address signal Add has a row address signal X and a column address signal Y applied in a time-divisionally multiplexed manner. When /RAS signal is at an active state (L level=logical low) at a rising edge of external clock signal ext.CLK, address signal Add is entered as a row address signal X (for example, Xa in FIG. 18).

Then, when /CAS signal is at an active state (L level) at a rising edge of external clock signal ext.CLK, address signal Add is entered as a column address signal Y (for example, Yb in FIG. 18).

Row and column selection is effected according to such entered row and column address signals Xa and Yb.

At an elapse of a predetermined clock period (six clock cycles in FIG. 18) from the fall of /RAS signal to an L level, the first 8 bits of data (q0) is output. Subsequently, data (q1–q7) is output in response to the rise of external clock signal ext.CLK.

In a write operation, row address signal X (Xc in FIG. 19) is entered according to a procedure similar to that of a read out operation as shown in FIG. 19. When /CAS signal and /WE signal both are at an active state (L level) at the rising edge of external clock signal ext.CLK, column address signal Y (Yd in FIG. 19) is entered and the input data d0 applied at that time is entered as the first write data. In response to the fall of signals /RAS and /CAS, the select operation of a row and column is effected. Input data d1–d7 are sequentially entered in synchronization with external clock signal ext.CLK to be written into a relevant memory cell.

In SDRAM 100, /RAS signal, /CAS signal, address signal Add and input data are entered at a rising edge of external clock signal ext.CLK which is a system clock, in contrast to the conventional method of a DRAM receiving an address signal Add and input data in synchronization with control signals (signals /RAS and /CAS).

The structure of operating in synchronization with an external clock signal is advantageous in that the margin for the data input/output time caused by the skew (deviation in timing) of address signal Add does not have to be ensured, so that the cycle time can be reduced. The continuous access time can be speeded if writing/reading of continuous data can be carried out in synchronization with a clock signal.

In a SDRAM, an internal clock signal CLK that drives the internal operation must be speeded in order to realize high speed operation. The art of incorporating a delay locked loop (referred to as DLL hereinafter) in the chip is proposed aimed to generate an internal clock signal int.CLK having a rising phase ahead of external clock signal ext.CLK.

Referring to FIG. 20, a conventional DLL circuit 90 includes a delay line 91, a clock buffer 93, a phase comparator 94, a select circuit 92, and a delay circuit 95.

DLL circuit 90 is a digital type DLL circuit that can suppress the power noise more than an analog type DLL circuit.

Clock buffer 93 outputs a clock signal ECLK according to external clock signal ext.CLK. Delay line 91 delays the input clock signal ECLK to provide an internal clock signal int.CLK. Internal clock signal int.CLK is delayed by delay circuit 95 to be provided to phase comparator 94 as a clock signal RCLK. Phase comparator 94 compares the phases between clock signals ECLK and RCLK to provide an up signal UP and a down signal DOWN so that the phases substantially match each other (synchronization established). Select circuit 92 is formed of a shift register to vary the delay time of delay line 91 according to up and down signals UP and DOWN. SDRAM 100 of FIG. 17 operates according to internal clock signal int.CLK.

Referring to FIG. 21, delay line 91 includes a plurality of NAND circuits (110.1, 110.2, . . . 110.n) and a plurality of inverter circuits (111.1, 111.2, . . . , 111.n) connected alternately, and a plurality of NAND circuits (112.1, 112.2, . . . 112.n) connected to respective input terminals of NAND circuits (110.1, 110.2, . . . , 110.n).

NAND circuit 110.1 has one input terminal connected to an internal power supply voltage Vcc. Internal clock signal int.CLK is output from inverter circuit 111.n.

The plurality of NAND circuits (112.1. 112.2, 112n) have respective one input terminals receive clock signal ECLK and the other respective input terminals receive control signals (s(1), s(2), . . . , s(n)) output from select circuit 92.

Any one of the control signals (s(1), s(2), s(n)) output from select circuit 92 is at an active state. The position where clock signal ECLK is input (more specifically, which of NAND circuits 110.1, . . . , 110.n the signal passes) depends upon the control signal (s(1), s(2), . . . , s(n)).

For the sake of simplification, the direction of s(1) is referred to as the first stage side and the direction of s(n) is referred to as the subsequent stage side in the series of the control signals (s(1), s(2), . . . , s(n)). When the delay period is too long, any of control signals $S(j+1)$, . . . , s(n) of the subsequent stage side is activated instead of the current active control signal s(j). When the delay period is too short, any of control signals $s(j-1)$, . . . , s(1) of the first stage side is activated instead of the active control signal s(j). Thus, the delay period of delay line 91 varies.

In a conventional DLL circuit 90 of the above-described structure, the step of change in the delay time depends upon NAND circuits (110.1, . . . , 110.n) and inverter circuits (111.1, . . . , 111.n).

There was a problem in the conventional DLL circuit 90 that phase synchronization cannot be established if the operating frequency of an input signal (for example, external clock signal ext.CLK) becomes too great since the delay time is varied in a step-like manner.

Furthermore, a high speed access operation cannot be realized with a SDRAM incorporating such a DLL circuit 90.

SUMMARY OF THE INVENTION

In view of the foregoing, an object of the present invention is to provide an internal clock signal generation circuit that can adjust the delay time minutely.

Another object of the present invention is to provide an internal clock signal generation circuit that can establish phase synchronization efficiently.

A further object of the present invention is to provide a synchronous type semiconductor memory device that allows high speed access operation by incorporating such an internal clock signal generation circuit.

According to an aspect of the present invention, an internal clock signal generation circuit generates an internal clock signal synchronizing in phase with an external clock signal. The internal clock signal generation circuit comprises a delay line for delaying the external clock signal and providing the internal clock signal, a phase detection circuit for detecting the phase difference between an external clock signal and an internal clock signal for determining a delay time required to delay the external clock signal, and a delay control circuit with a plurality of capacitors provided parallel to the delay line for controlling the current flow between the delay line and the plurality of capacitors in a digital manner according to the detection result of the phase difference of the phase detection circuit so that the external clock signal and the internal clock signal attain phase synchronization.

The main advantage of the invention of the present aspect is that an internal clock signal synchronizing in phase efficiently and at high accuracy can be generated over a wide range of frequencies by virtue of fine-adjustment of the varying step of the delay time according to the phase difference between an external clock signal and an internal clock signal in an internal clock signal generation circuit.

An internal clock signal generation circuit according to another aspect of the present invention generates an internal clock signal synchronizing in phase and in frequency with an external clock signal. The internal clock signal generation circuit includes an oscillation circuit with a delay line that determines the oscillating frequency of the internal clock signal, a phase detection circuit for detecting the phase difference between the external clock signal and the internal clock signal output from the oscillation circuit to determine the delay time required to delay the external clock signal, and a delay control circuit with a plurality of capacitors provided parallel to the delay line for controlling the current flow between the delay line and the plurality of capacitors in a digital manner according to the detection result of the phase difference from the phase detection circuit to adjust the delay time of the delay line so that the phases of the external clock signal and the internal clock signal are in synchronization.

Therefore, the main advantage of the invention according to the present aspect is that an internal clock signal can be generated synchronizing in phase and in frequency efficiently and at a high accuracy over a wide range of frequencies by virtue of fine-adjustment of the step of varying the delay time according to the phase difference between the external clock signal and the internal clock signal.

A synchronous type semiconductor memory device according to a further aspect of the present invention accepts an external signal including a control signal, an address signal, and an input signal in synchronization with an external clock signal. The synchronous semiconductor memory device includes a memory array with a plurality of memory cells arranged in a matrix of rows and columns, an internal clock generation circuit for providing an internal clock signal synchronizing in phase with an external clock signal, and a data input/output circuit for selecting a memory cell to write/read data with respect to the selected memory cell in synchronization with the internal clock signal. The internal clock signal generation circuit includes a delay line for delaying an external clock signal and providing an internal clock signal, a phase detection circuit for detecting the phase difference between the external clock signal and the internal clock signal to determine a delay time required to delay the external clock signal, and a delay control circuit with a plurality of capacitors provided parallel to the delay line for controlling the current flow between the delay line and the plurality of capacitors in a digital manner according to the detection result of the phase difference from the phase detection circuit to adjust the delay time of the delay line so that the external clock signal and the internal clock signal synchronize in phase.

The main advantage of the synchronous type semiconductor memory device according to the present aspect of the invention is that a high speed access operation can be realized by incorporating an internal clock signal generation circuit that can generate an internal clock signal synchronizing in phase efficiently and at high accuracy over a wide range of frequencies with respect to an external clock signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
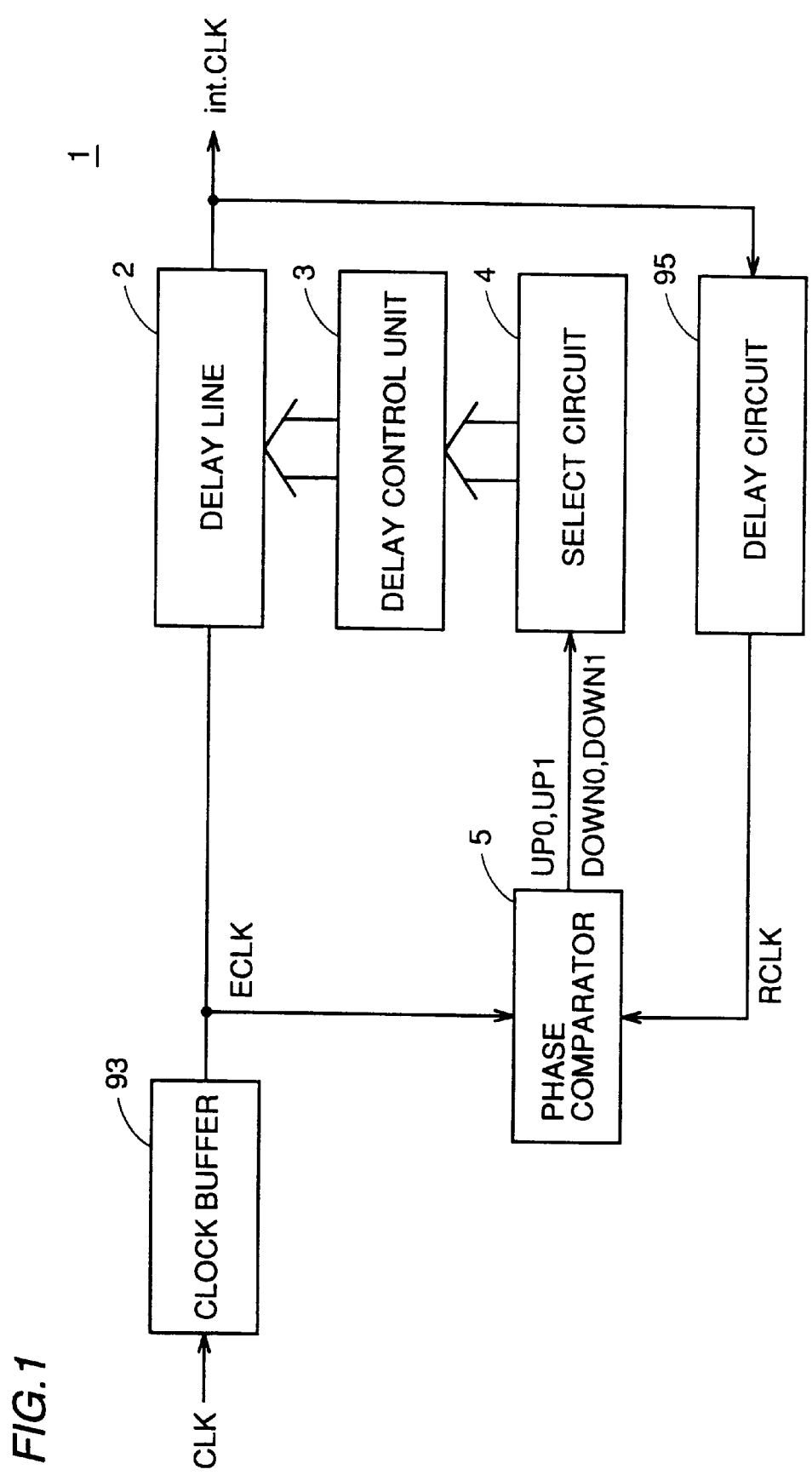
FIG. 1 is a block diagram showing an entire structure of a DLL circuit 1 according to a first embodiment of the present invention.

An internal clock signal generation circuit and a synchronous semiconductor memory device of the present invention will be described hereinafter. Like components are shown by corresponding reference characters throughout the specification. Description thereof will not be repeated.

First Embodiment

In an internal clock signal generation circuit including a delay line according to the first embodiment of the present invention, fine-adjustment of the delay time of the delay line is allowed by varying the capacitance of the delay line in a digital manner. In a synchronous type semiconductor memory device, a high speed operation is allowed by incorporating such an internal clock signal generation circuit.

Figure 16:
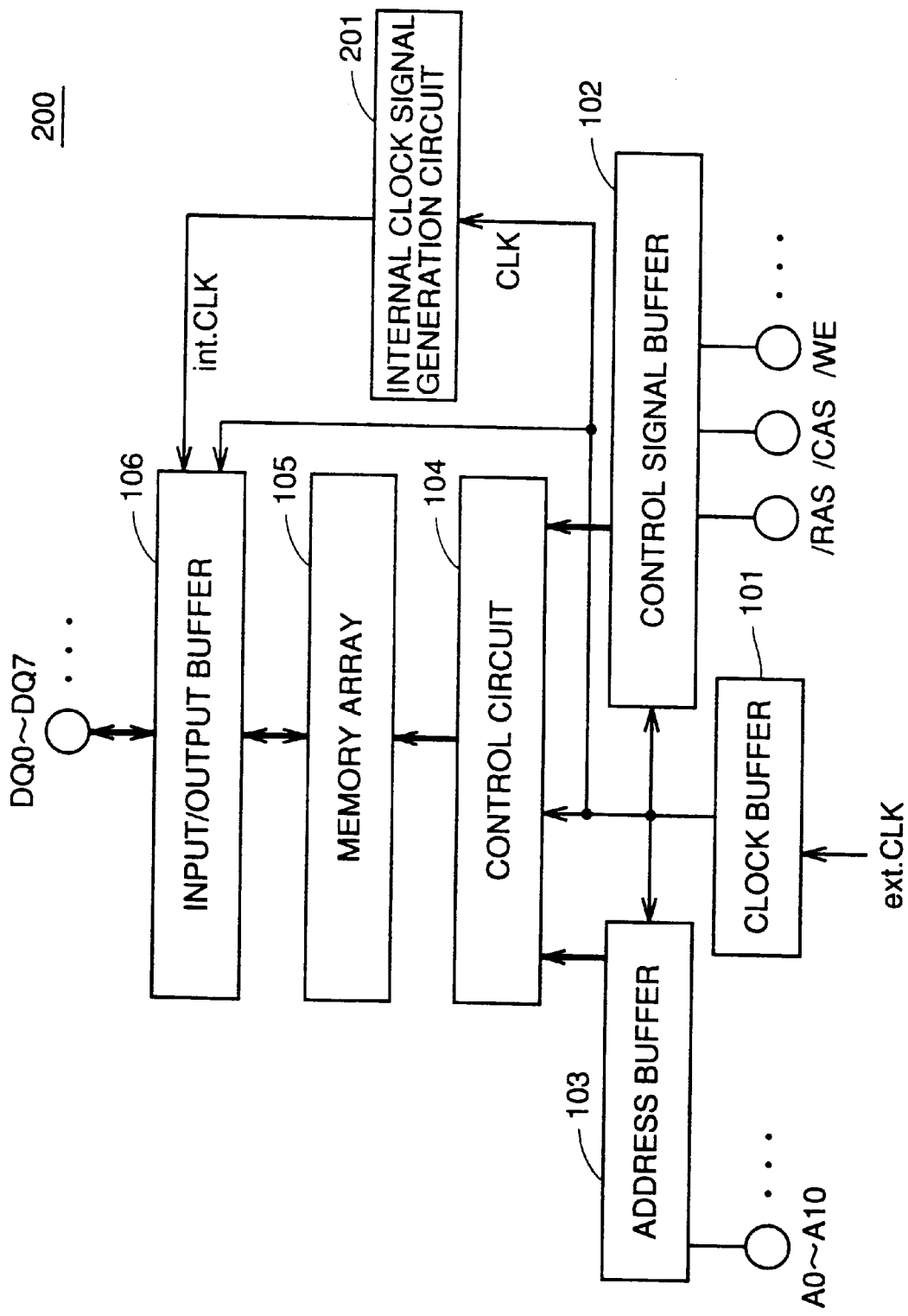
FIG. 16 is a block diagram showing a basic structure of a SDRAM 200 according to the first embodiment of the present invention.
Figure 17:
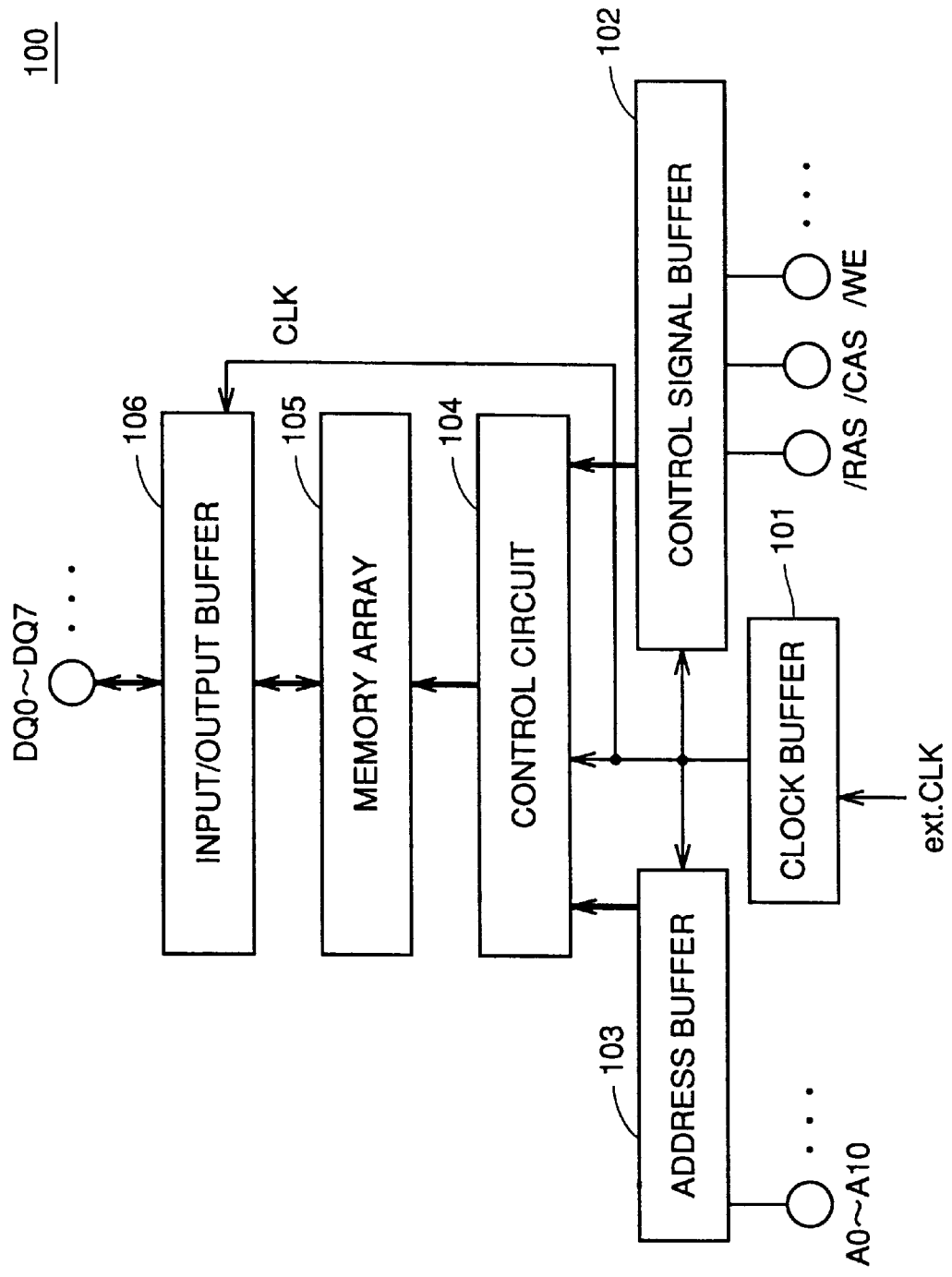
FIG. 17 is a block diagram showing a basic structure of a conventional SDRAM 100.
Figure 18:
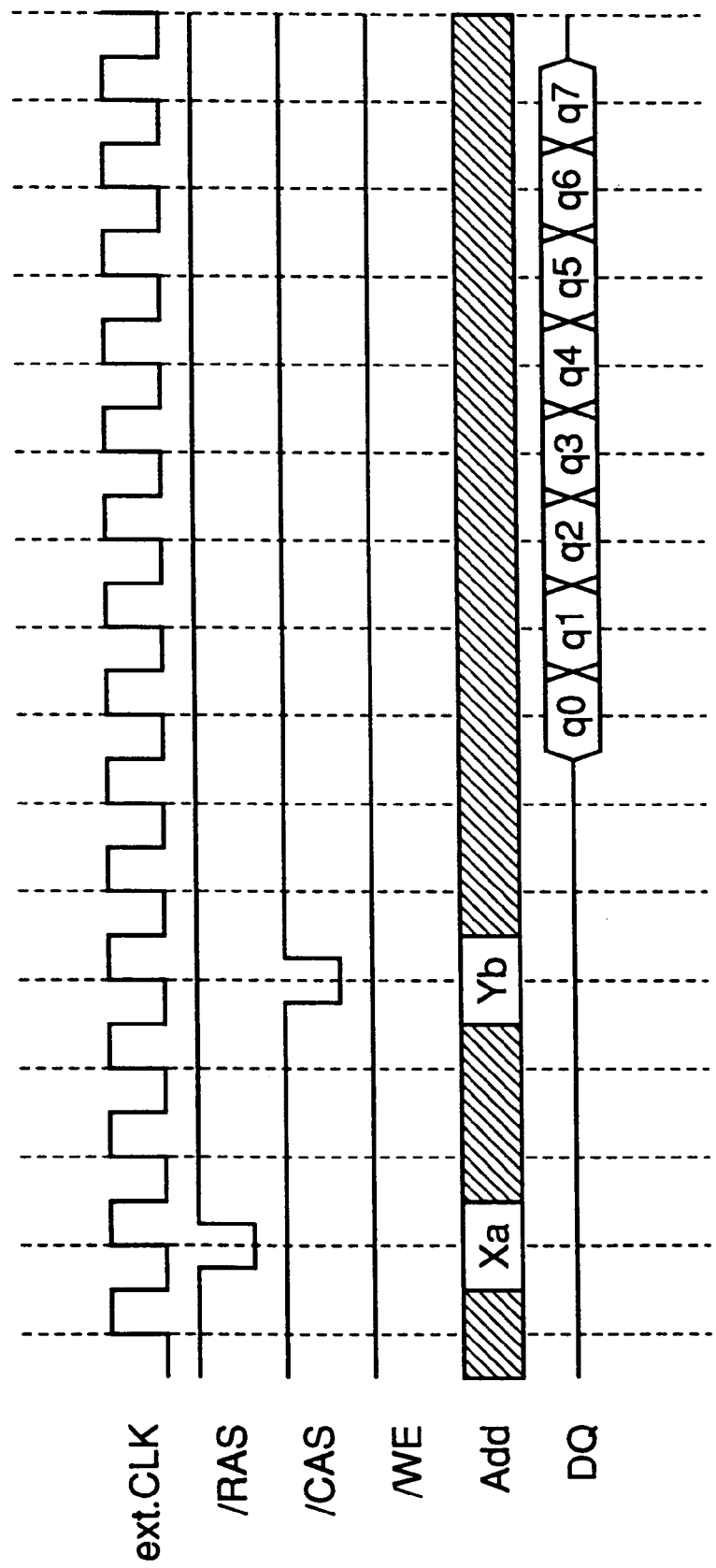
FIG. 18 is a timing chart of various signals to carry out a read out operation of 8 bits continuously from a conventional SDRAM 100.
Figure 19:
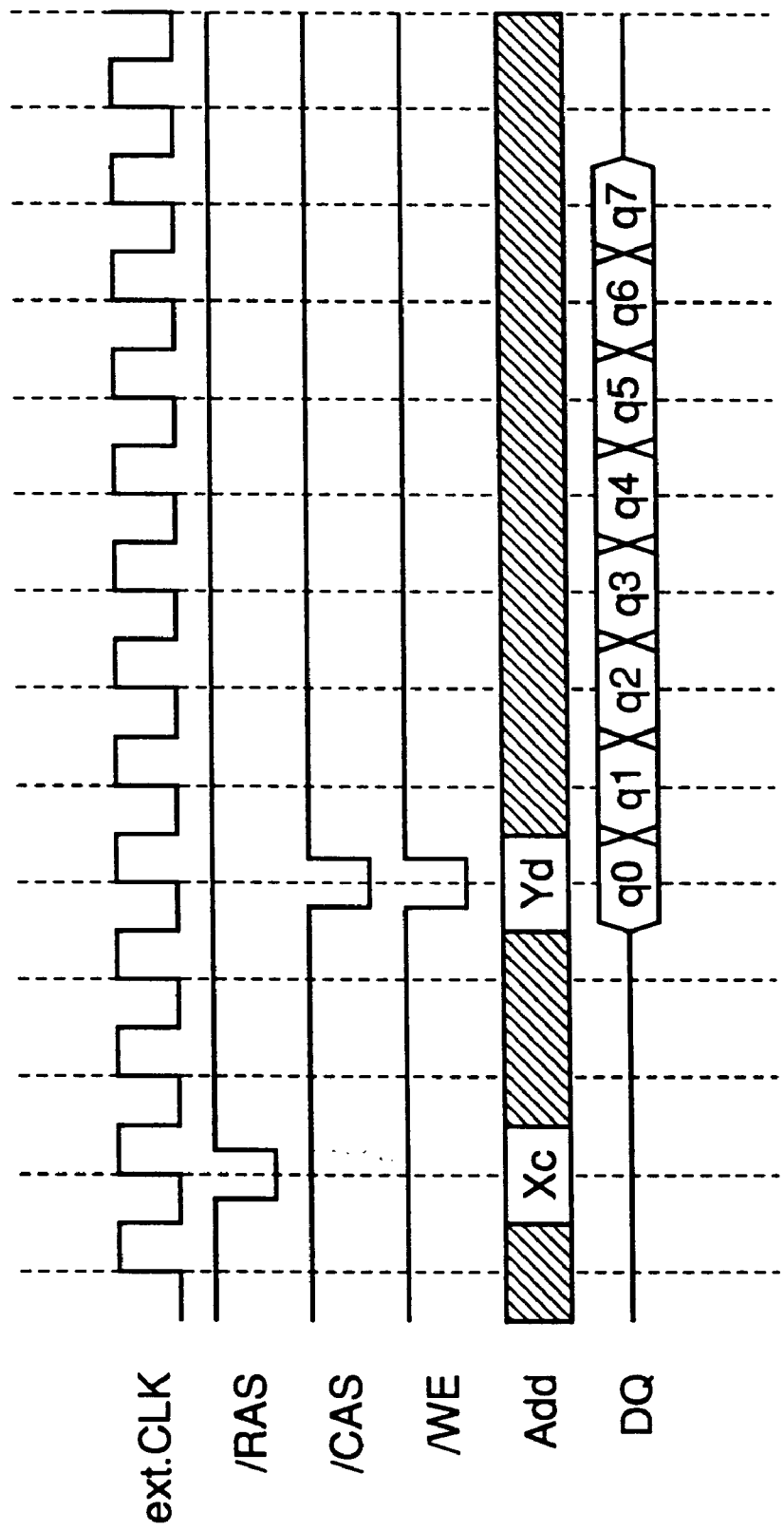
FIG. 19 is a timing chart of various signals for writing 8 bits continuously from a conventional SDRAM 100.

A SDRAM 200 according to the first embodiment of the present invention shown in FIG. 16 differs from the conventional SDRAM 100 in that an internal clock signal generation circuit 201 that can adjust the delay time minutely is provided. Internal clock signal generation circuit 201 receives a clock signal CLX to output an internal clock signal int.CLK in phase-synchronization. SDRAM 200 inputs/outputs data at high speed according to internal clock signal int.CLK.

A DLL circuit will be described hereinafter as a specific example of internal clock signal generation circuit 201 according to the first embodiment of the present invention.

Referring to FIG. 1, a DLL circuit 1 according to the first embodiment of the present invention outputs a signal (for example, internal clock signal int.CLK) synchronizing in phase with the input signal (for example, clock signal CLK).

Figure 20:
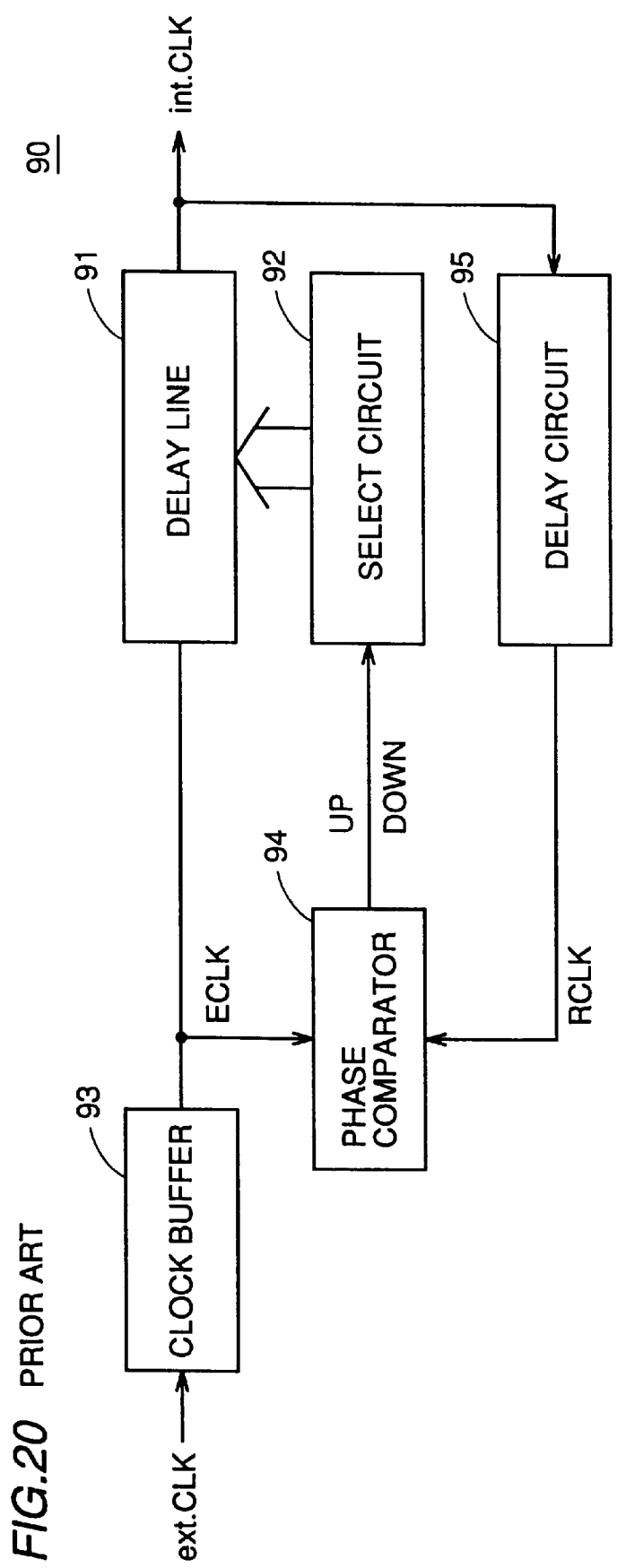
FIG. 20 is a block diagram showing a basic structure of a conventional DLL circuit 90.
Figure 21:
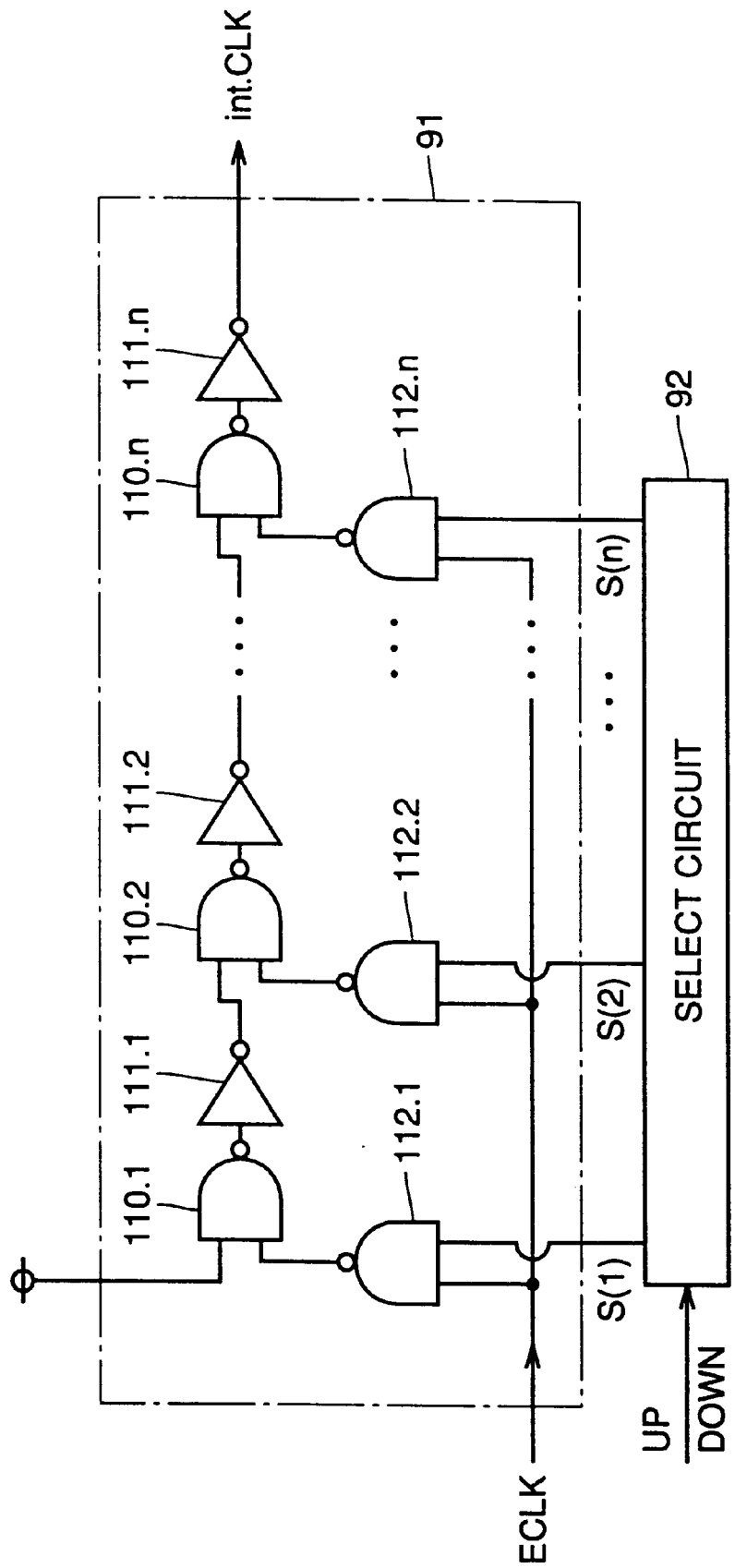
FIG. 21 is a circuit diagram showing a basic structure of a delay line 91 of a conventional DLL circuit 90.

DLL circuit 1 of the first embodiment differs from the conventional DLL circuit 90 shown in FIGS. 20 and 21 in that a delay line 2 including a plurality of inverter circuits (I1, I2, . . . , In) is provided instead of delay line 91, and that a delay control unit 3 for controlling the variation in the delay time in each of the plurality of inverter circuits (I1, I2, . . . , In) is provided. Furthermore, a select circuit 4 and a phase comparator 5 are provided instead of select circuit 92 and phase comparator 94, respectively.

Figure 2:
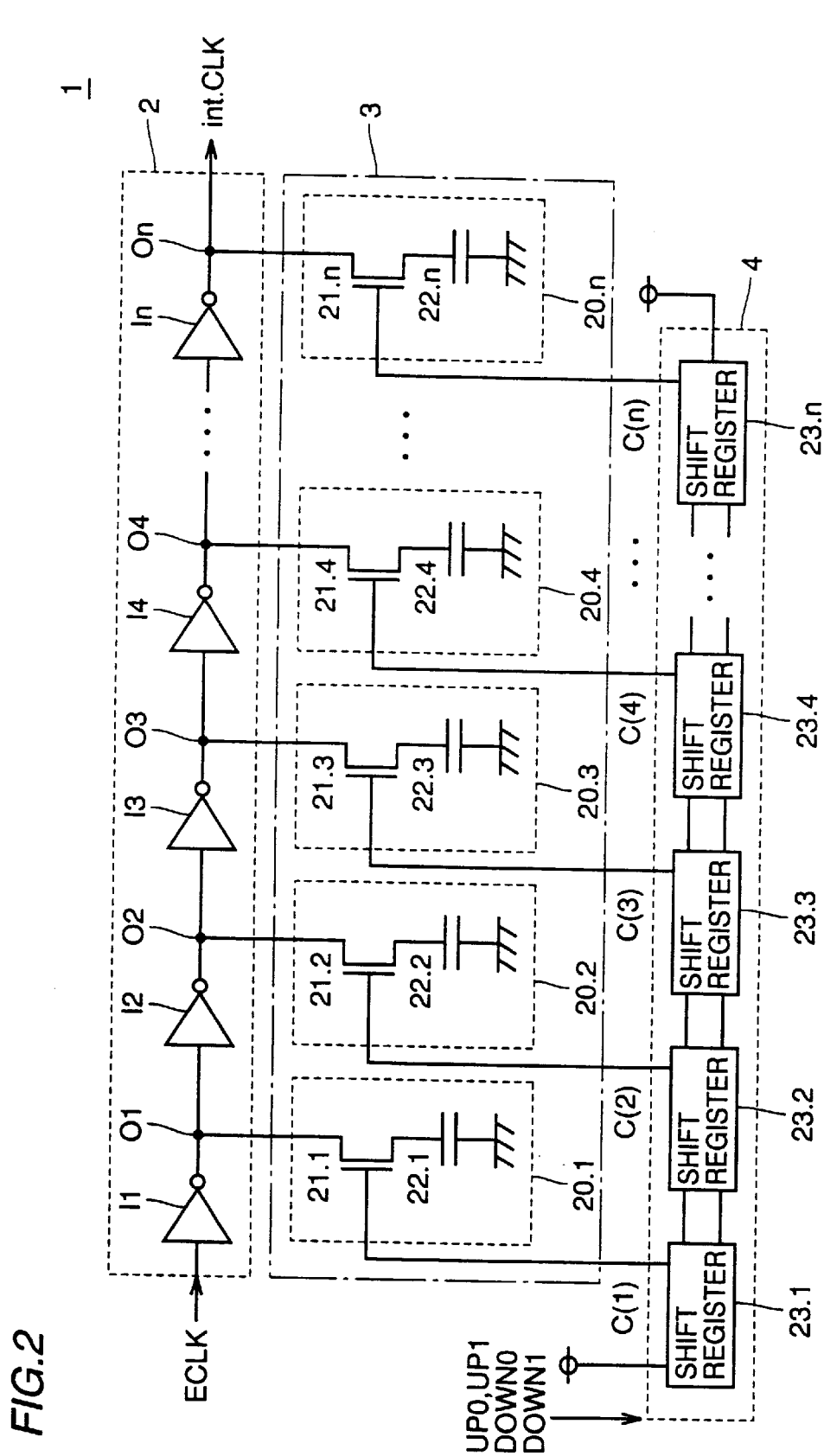
FIG. 2 is a circuit diagram showing a basic structure of the main components of DLL circuit 1 of the first embodiment of the present invention.

Referring to FIGS. 1–2 of DLL circuit 1, delay line 2 includes a plurality of inverter circuits (I1, I2, . . . , In; where n is an even number) connected in series. Inverter circuit I1 receives a clock signal ECLK from clock buffer 93 to output an internal clock signal int.CLK from inverter circuit In.

Delay control unit 3 includes a plurality of control circuits (20.1, 20.2, . . . , 20.n). Control circuits (20.1, 20.2, . . . , 20.n) are provided corresponding to inverter circuits (I1, I2, . . . , In), respectively. Each control circuit (20.1, 20.2, . . . , 20.n) includes one NMOS transistor (21.1, . . . , 21.n) which is a switch, and one capacitor (22.1, . . . , 22.n).

Each NMOS transistor (21.1, . . . , 21.n) receives a control signal (C(1), . . . , C(n)) from select circuit 4 that will be described afterwards.

The structure of a control circuit 20.1 will be described specifically hereinafter. Control circuit 20.1 includes an NMOS transistor 21.1 and a capacitor 22.1. Capacitor 22.1 has one electrode connected to ground potential Vss. NMOS transistor 21.1 is connected between an output node O1 of inverter circuit I1 and the other electrode of capacitor 22.1, and receives a control signal C(1) from select circuit 4 at its gate electrode. NMOS transistor 21.1 is rendered conductive upon receiving control signal C(1) of an H level (logical high).

The operation of a control circuit (20.1, 20.2, ..., 20.n) will be described briefly hereinafter. In the following description, each NMOS transistor (21.1, 21.2, ..., 21.n) is called a switch (21.1, 21.2, ..., 21.n). The conductive/non-conductive state of each NMOS transistor (21.1, 21.2, ..., 21.n) corresponds to the on state/off state of a corresponding switch (21.1, 21.2, ..., 21.n).

Each switch (21.1, 21.2, ..., 21.n) is turned on/off according to a control signal (C(1), C(2), ..., C(n)) from select circuit 4. When each switch (21.1, 21.2, ... 21.n) attains an on state, a corresponding output node (O1, O2, ..., On) is electrically connected to a corresponding capacitor (22.1, 22.2, ..., 22.n) to cause change in the capacitance of a corresponding output node (O1, O2, ... On).

As a result, when switch 21.2, for example, is turned on, the potential of the output signal of a corresponding output node O2 shows a mild transition with a value determined by the capacitance value of capacitor 22.2. More specifically, the delay time of delay line 2 is adjusted minutely by turning on/off each switch (21.1, 21.2, ..., 21.n). Furthermore, the discrete step of the altered delay time of delay line 2 can be set more finely by reducing the size of each capacitor (22.1, ... 22.n).

The structure and operation of select circuit 4 will be described hereinafter. Select circuit 4 includes a plurality of shift registers (23.1, 23.2, ..., 23.n). Shift registers (23.1, 23.2, ..., 23.n) are provided corresponding to control circuits (20.1, 20.2, ..., 20.n).

Figure 3:
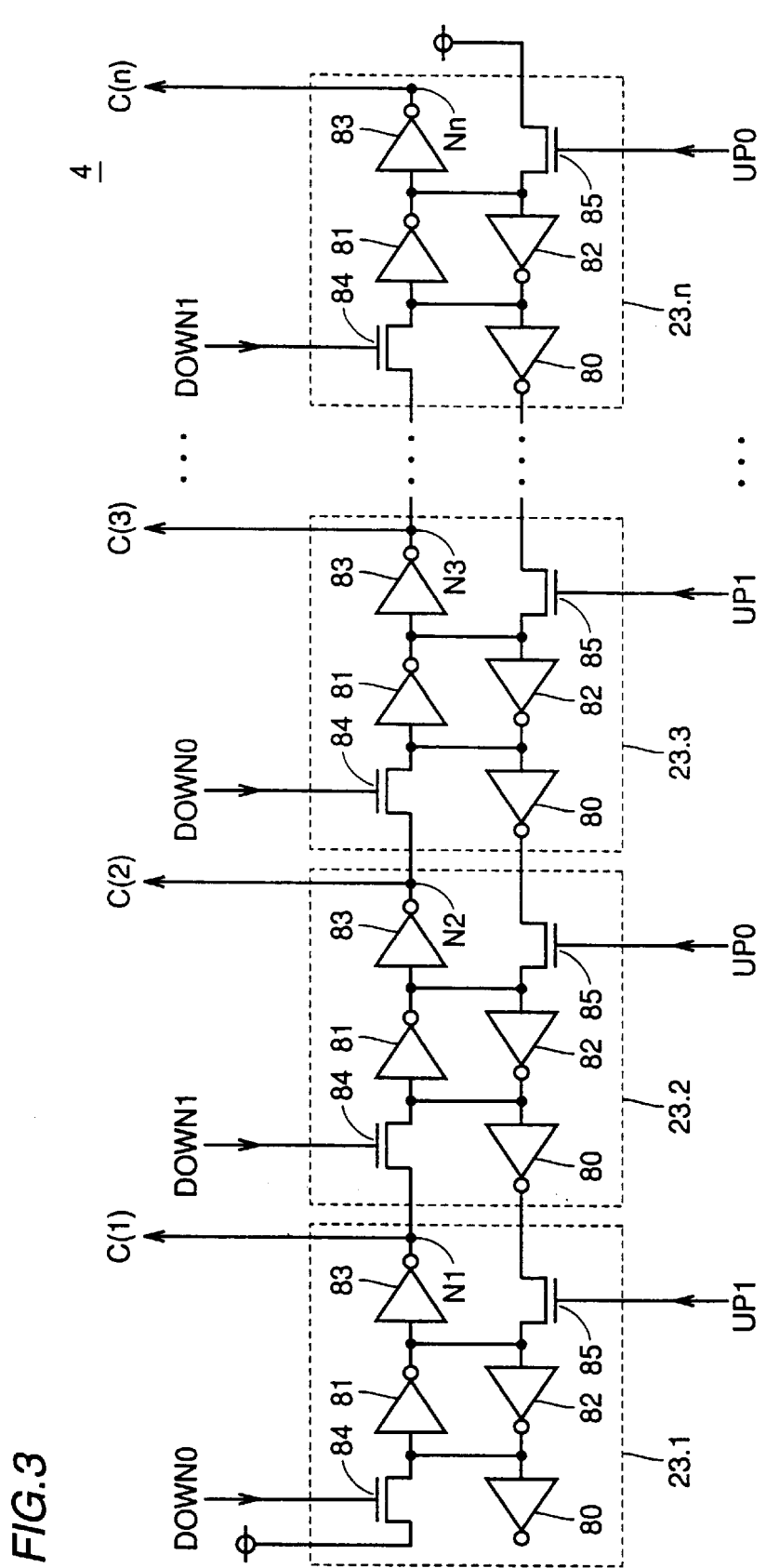
FIG. 3 is a circuit diagram showing a basic structure of a select circuit 4 according to the first embodiment of the present invention.

Each shift register (23.1, 23.2, ..., 23.n) shown in FIG. 3 includes four inverter circuits 80, 81, 82 and 83, and two NMOS transistors 84 and 85.

Each shift register (23.1, 23.2, ..., 23.n) changes its state according to down 0 signal DOWN0, down 1 signal DOWN1, up 0 signal UP0, and up 1 signal UP1 provided from phase comparator 5 that will be described afterwards.

NMOS transistor 84 of each shift register (23.1, 23.3, ..., 23.n−1) receives down 0 signal DOWN0 at its gate electrode. NMOS transistor 85 receives up 1 signal UP1 at its gate electrode. NMOS transistor 84 of each shift register (23.2, ..., 23.n) receives down 1 signal DOWN1 at its gate electrode. NMOS transistor 85 receives up 0 signal UP0 at its gate electrode.

A control signal (C(1), C(2), ..., C(n)) is output from an output node (N1, N2, ..., Nn) of each inverter circuit 83.

NMOS transistor 84 of shift register 23.1 and NMOS transistor 85 of shift register 23.n have each one electrode connected to an internal power supply voltage Vcc.

The operation of shift register 23.2 will be described hereinafter. When down 1 signal DOWN1 is driven to an H level, NMOS transistor 84 attains a conducting state. Accordingly, the potential of output node N2 (namely control signal C(2)) varies according to the potential of output node N1 (namely, control signal C(1)) of shift register 23.1 located at a preceding stage. When down 1 signal DOWN1 falls to an L level, NMOS transistor 84 is rendered non-conductive. Accordingly, control signal C(2) maintains a potential which is an inversion of the potential latched by inverter circuits 81 and 82.

When up 0 signal UP0 rises to an H level, NMOS transistor 85 is rendered conductive. In response, the potential of control signal C(2) varies according to the potential of output node N3 (namely, control signal C(3)) of shift register 23.3 located at a preceding stage. When up 0 signal UP0 falls to an L level, NMOS transistor 85 attains a non-conductive state. In response, control signal C(2) maintains a potential which is an inversion of the potential latched by inverter circuits 81 and 82.

By activating down 0 signal DOWN0 and down 1 signal DOWN1 alternately according to the above-described structure, control signals (C(1), ..., C(n)) are sequentially activated in one direction. A specific example is indicated by the following expressions (1)–(3).

$$(C(1), ..., C(n)) \rightarrow (1, 1, 0, 0, 0, ..., 0) \quad (1)$$

$$\rightarrow (1, 1, 1, 0, 0, ..., 0) \quad (2)$$

$$\rightarrow (1, 1, 1, 1, 0, ..., 0) \quad (3)$$

When up 0 signal UP0 and up 1 signal UP1 are activated alternately, control signals (C(1), ..., C(n)) are deactivated sequentially in another direction.

Specific examples thereof are indicated by expressions (4)–(6).

$$(C(1), ..., C(n)) \rightarrow (1, 1, 1, 1, 0, ..., 0) \quad (4)$$

$$\rightarrow (1, 1, 1, 0, 0, ..., 0) \quad (5)$$

$$\rightarrow (1, 1, 0, 0, 0, ..., 0) \quad (6)$$

The structure and operation of phase comparator 5 that controls select circuit 4 will be described hereinafter.

Figure 4:
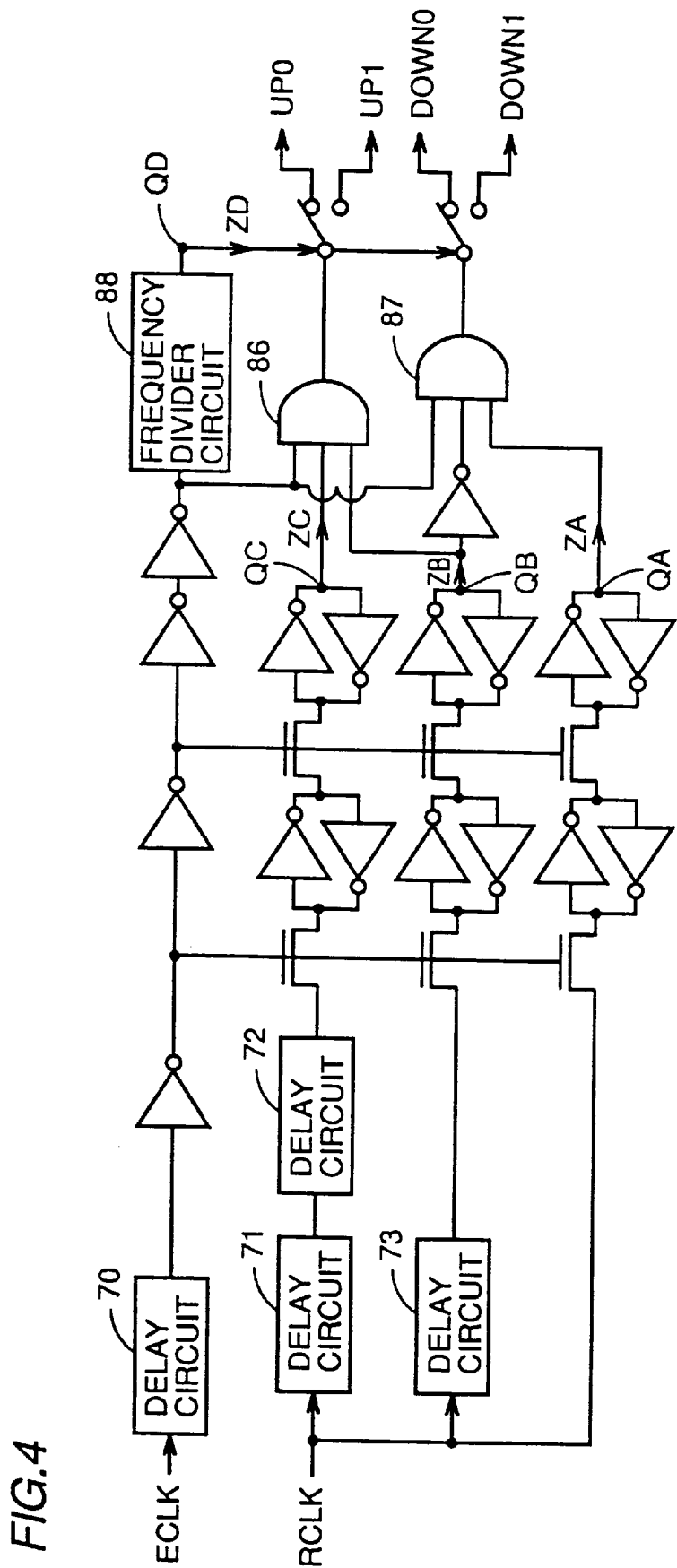
FIG. 4 is a circuit diagram showing a basic structure of a phase comparator 5 according to the first embodiment of the present invention.

Referring to FIG. 4, phase comparator 5 detects the phase difference between a clock signal ECLK from a clock buffer 3 and a clock signal RCLK from delay circuit 95. More specifically, in response to a signal ZA of a node QA, a signal ZB of a node QB, and a signal ZC of a node QC shown in FIG. 4, a down signal (down 0 signal DOWN0, down 1 signal DOWN1) that delays clock signal RCLK, or an up signal (up 0 signal UP0 or up 1 signal UP1) that advances clock signal RCLK are output.

Figure 5:
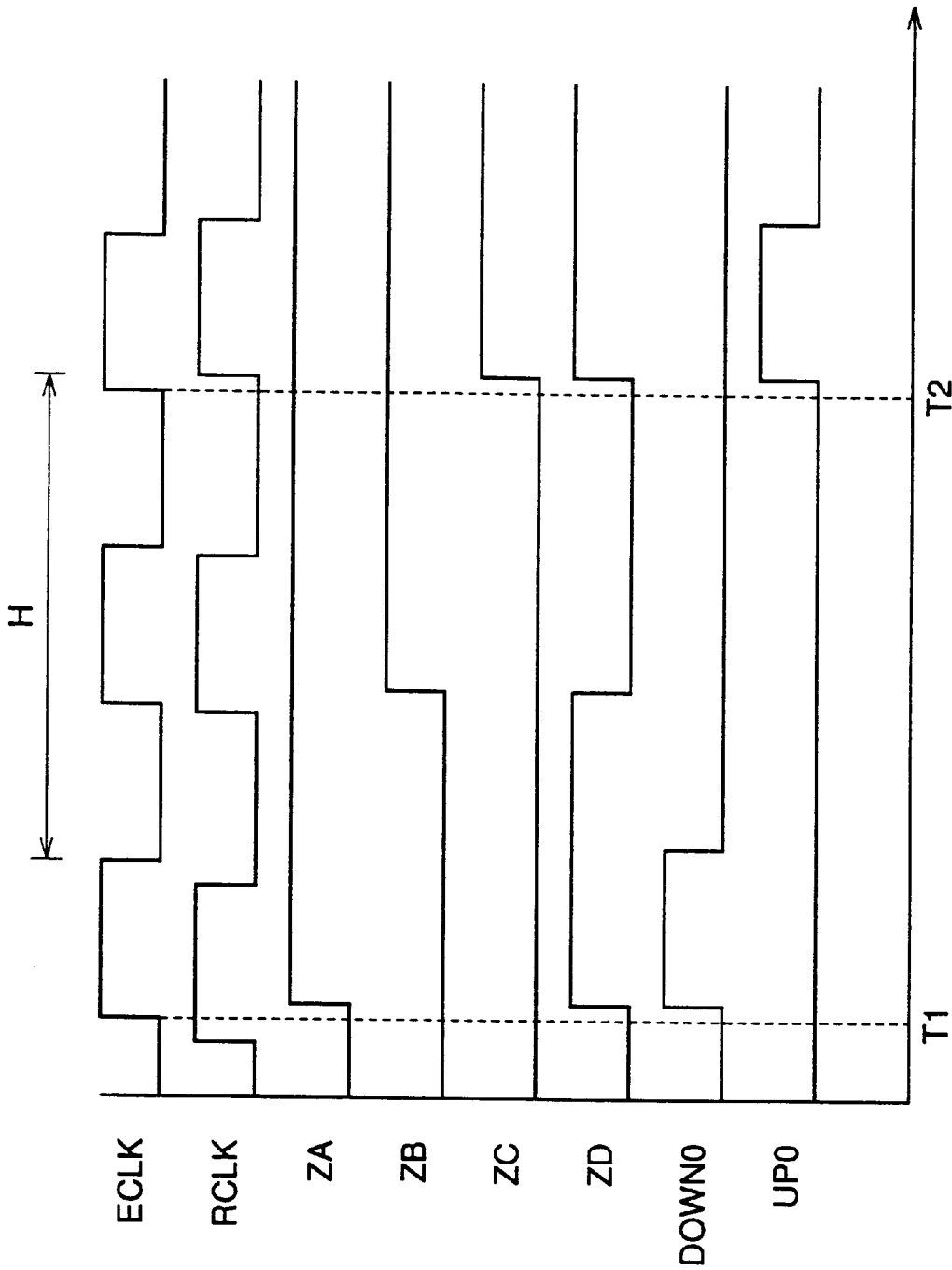
FIG. 5 is a timing chart for describing an operation of phase comparator 5 according to the first embodiment of the present invention.

Referring to FIGS. 4 and 5, when clock signal ECLK is behind clock signal RCLK (time T1), signal ZA attains an H level and signals ZB and ZC attain an L level. AND circuit 87 provides a signal output of an H level. The output of AND circuit 87 is switched between down 0 signal DOWN0 and down 1 signal DOWN1 according to a frequency-divided signal ZD on an output node QD of a 2-frequency divider 88 that divides a signal frequency by a factor of 2.

When clock signal ECLK is ahead of clock signal RCLK (time T2), signals ZA, ZB and ZC all attain an H level. AND circuit 86 provides an output signal of an H level. The output of AND circuit 86 is switched between up 0 signal UP0 and up 1 signal UP1 according to frequency-divided signal ZD from 2 frequency divider 88.

The period H in FIG. 5 corresponds to the period of time where down 0 signal DOWN0, down 1 signal DOWN1, up 0 signal UP0 and up 1 signal UP1 are not activated, and is termed dead zone H. This dead zone H is determined by the respective delay time of delay circuits 70, 71, 72 and 73 (referred to FIG. 4) in phase comparator 5. This dead zone H is necessary to prevent the state of continuously providing an up signal and a down signal alternately (the so-called chattering).

The operation of DLL circuit 1 according to the first embodiment of the present invention will be described hereinafter.

Figure 6:
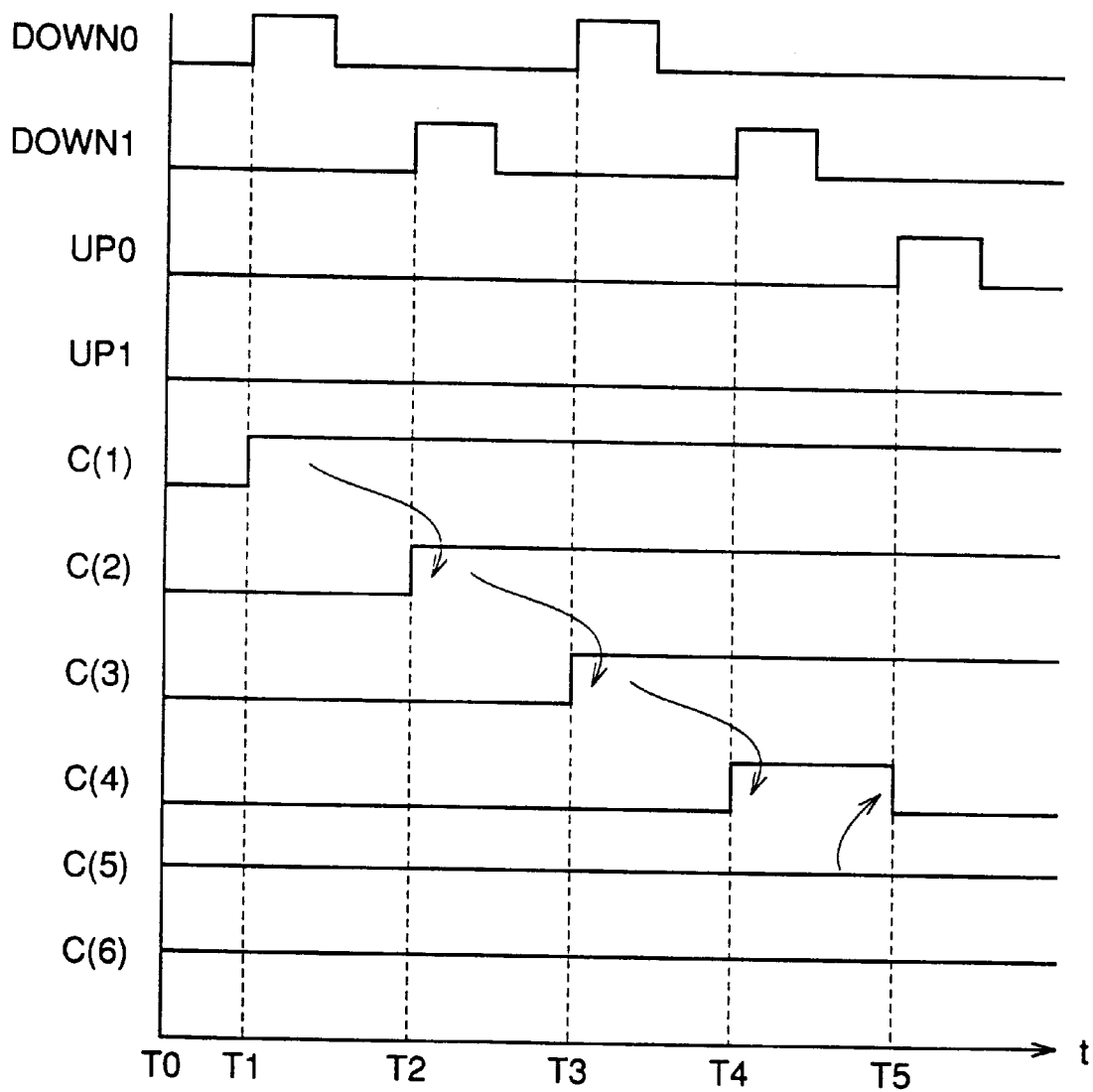
FIG. 6 is a timing chart showing the relationship between a down 0 signal DOWN0, a down 1 signal DOWN1, an up 0 signal UP0, and an up 1 signal UP1 output from phase comparator 5 and the output of select circuit 4.

The case of retarding and advancing the delay time of delay line 2 as shown in FIGS. 2 and 6 will be described. It is assumed that delay line 2 is formed of inverter circuits (I1, I2, ..., I6).

At time T0, all the control signals (C(1), C(2), ..., C(6)) attain an L level. All switches (21.1, 21.2, ..., 21.6) are turned off. The delay time of delay line 2 is determined by the gate capacitance in inverter circuits (I1, I2, ..., I6) and the drain capacitance of NMOS transistors (21.1, 21.2, ..., 21.6).

When the delay time is to be retarded in a minute manner, down 0 signal DOWN0, for example, of an H level is generated (time T1). The transition state of each control signal (C(1), C(2), ..., C(6)) is shown in expression (7).

$$(0, 0, 0, 0, 0, 0) \rightarrow (1, 0, 0, 0, 0, 0) \quad (7)$$

Upon receiving internal power supply voltage Vcc, control signal C(1) is pulled up to an H level. In response, switch 21.1 is turned on, whereby the delay time of delay line 2 is increased by the time determined by the capacitance of capacitor 22.1.

Then, when the delay time is to be retarded minutely, down 1 signal DOWN1 of an H level is generated (time T2). The transition of each control signal (C(n), C(2), C(6)) is shown in expression (8).

$$(1, 0, 0, 0, 0, 0) \rightarrow (1, 1, 0, 0, 0, 0) \quad (8)$$

Control signal C(2) is pulled up to an H level. In response, switch 21.2 is also turned on. The delay time of delay line 2 is increased by the time determined by the capacitance of capacitor 22.2.

When down 0 signal DOWN0 of an H level is generated (time T3), control signal C(3) is pulled up to an H level. In response, switch 21.3 is also turned on. The delay time of delay line 2 is further increased by the time determined by the capacitance of capacitor 22.3.

When down 1 signal DOWN1 of an H level is generated (time T4), control signal C(4) is pulled up to an H level. In response, switch 21.4 is also turned on. The delay time of delay line 2 is further increased by the time determined by capacitance of capacitor 22.4.

In order to advance the delay time, an up 0 signal UP0 of an H level is generated (time T5). The transition of each of control signals (C(1), C(2), ..., C(6)) is shown in expression (9).

$$(1, 1, 1, 1, 0, 0) \rightarrow (1, 1, 1, 0, 0, 0) \ldots (9)$$

In this case, control signal C(4) is pulled down to an L level. In response, switch 21.4 is turned off, and capacitor 22.4 connected to inverter circuit I4 attains a non-conductive state.

According to the above structure, DLL circuit 1 of the first embodiment can have the delay time of delay line 2 fine-adjusted in a digital manner.

There may be a plurality of capacitors connected to each inverter circuit (I1, I2, ..., In).

Another DDL circuit according to the first embodiment will be described with reference to FIG. 7. A DLL circuit 8 shown in FIG. 7 can have a plurality of capacitors connected in a digital manner to each inverter circuit (I1, I2, ..., In).

Figure 7:
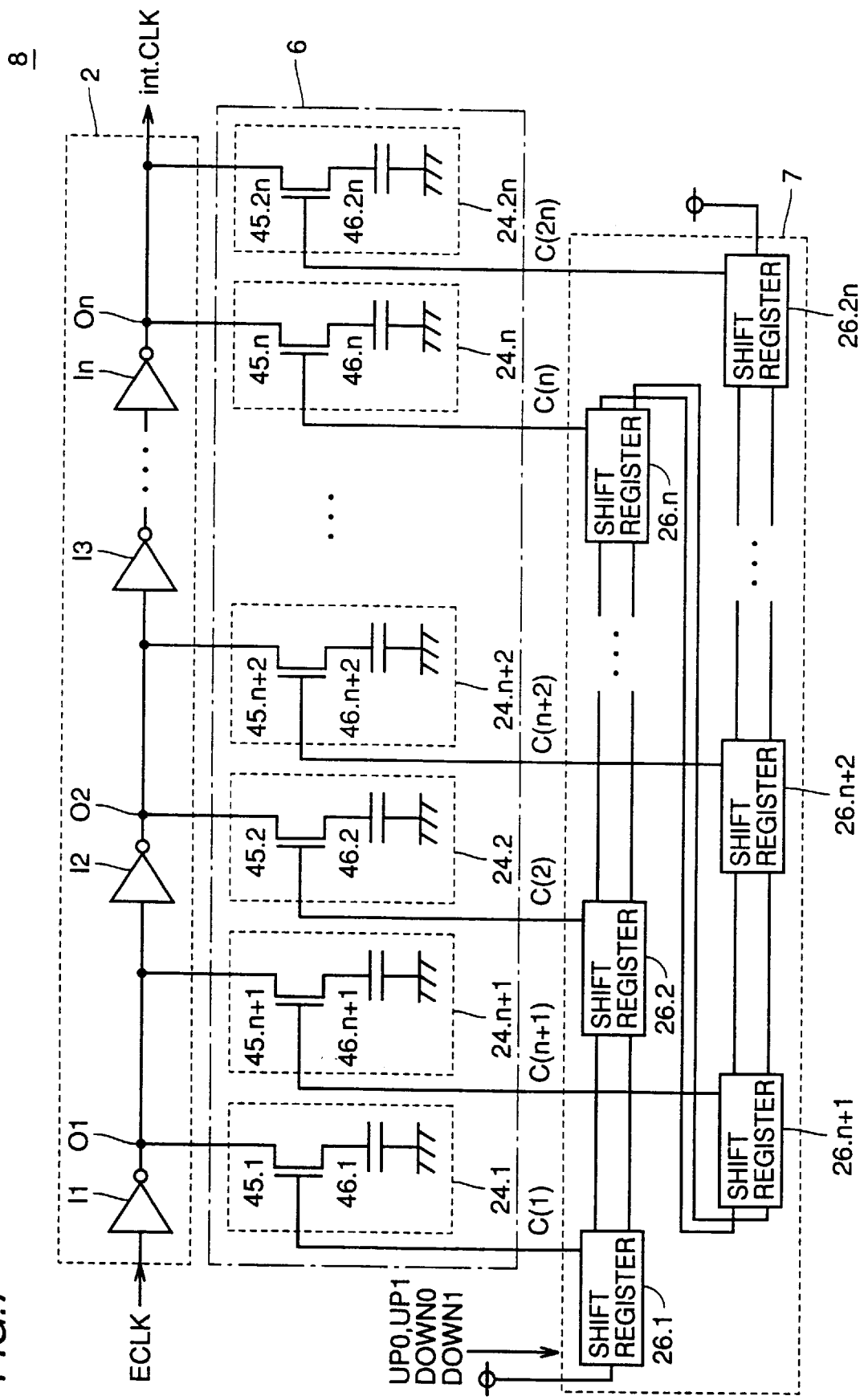
FIG. 7 shows a basic structure of the main components of a DLL circuit 8 according to the first embodiment of the present invention.

Referring to FIG. 7, a delay control unit 6 includes a plurality of control circuits (24.1, 24.2, ..., 24.2n). Each control circuit (24.1, 24.2, ..., 24.2n) includes one capacitor (46.1, 46.2, ..., 46.2n), and one NMOS transistor (45.1, 45.2, ..., 45.2n).

Each of control circuits (24.1, 24.n+1), (24.2, 24.n+2), ..., and (24.n, 24.2n) is provided corresponding to each inverter circuit (I1, I2, ..., In). More specifically, each of control circuits (24.1, 24.n+1), (24.2, 24.n+2), ..., and (24.n, 24.2n) is connected parallel to a corresponding output node (O1, O2, ..., On).

Select circuit 7 includes a plurality of shift registers (26.1, ..., 26.n, 26.n+1, ..., 26.2n). The structure of each shift register (26.1, ..., 26.n, 26.n+1, ..., 26.2n) is identical to the above-described structure of shift register (23.1, ..., 23.n).

Control signals (C(1), C(2), ..., C(n)) output from shift registers (26.1, 26.2, ..., 26.n) selectively control control circuits (24.1, 24.2, ..., 24.n). Control signals (C(n+1), C(n+2), ..., C(2n)) output from shift registers (26.n+1, 26.n+2, ..., 26.2n) selectively control control circuits (24.n+1, 24.n+2, ..., 24.2n).

Control signals (C(1), C(2), ..., C(2n)) exhibit a transition so as to be sequentially activated in one direction and deactivated in the other direction as described before.

According to the above structure, the delay time of the delay line 2 can be fine-adjusted in a digital manner.

When the above-described DLL circuits 1 and 8 are employed as internal clock signal generation circuit 201 of SDRAM 200 shown in FIG. 16, a high speed access operation can be realized in SDRAM 200.

The internal clock signal generation circuit of the present invention is not limited to a DLL circuit, and can be applied also to a PLL circuit.

A PLL circuit according to the first embodiment of the present invention will be described with reference to FIG. 8. A PLL circuit 55 of the present embodiment generates an internal clock signal int.CLK synchronizing in phase and in frequency with clock signal CLK.

Figure 8:
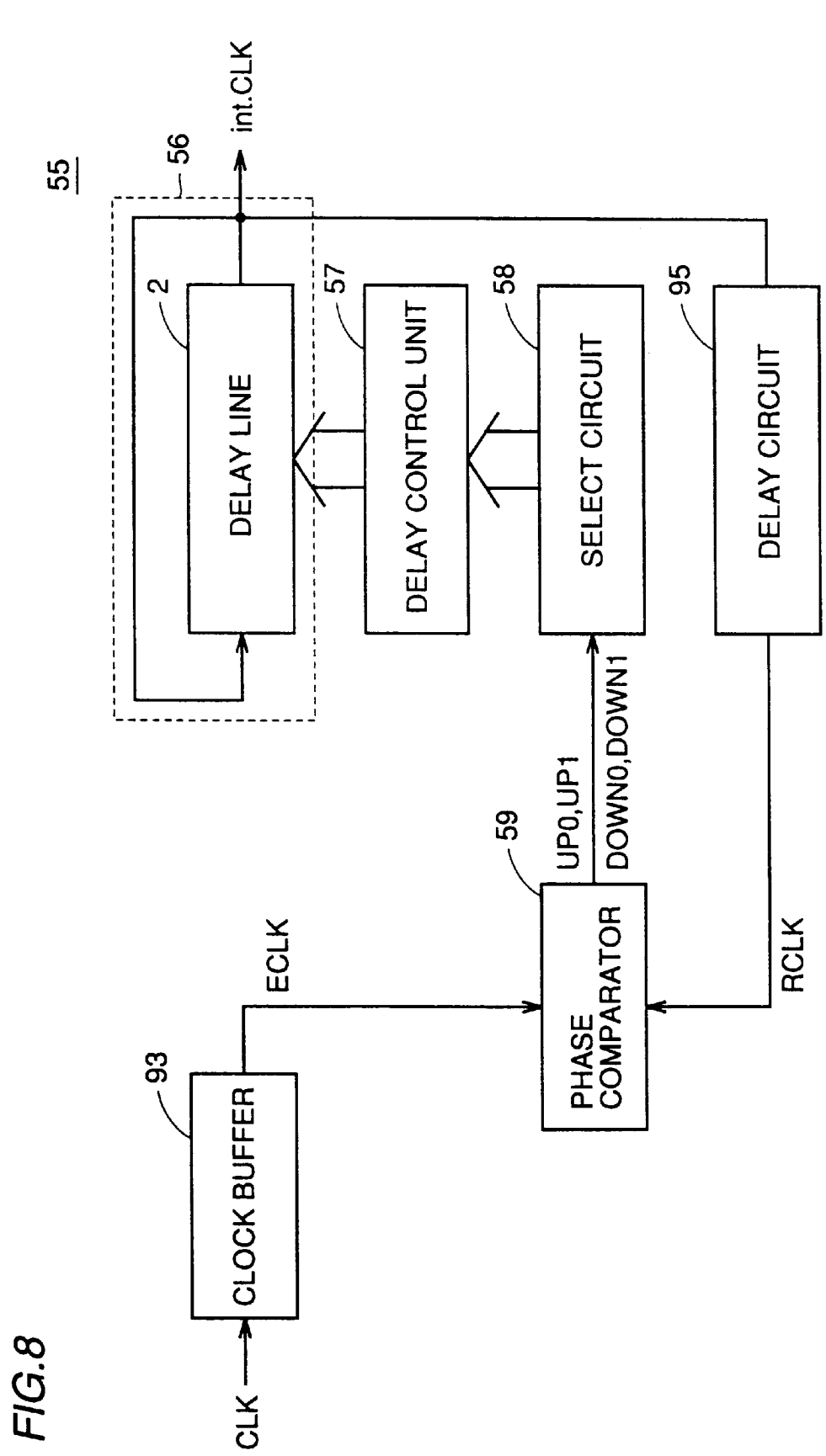
FIG. 8 is a block diagram showing a basic structure of the main components of a PLL circuit 55 according to the first embodiment of the present invention.

Referring to FIG. 8, a PLL circuit 55 includes a clock buffer 93, an oscillator 56 including a delay line 2, a delay control unit 57, a select circuit 58, a phase comparator 59, and a delay circuit 95. Delay line 2 determines the oscillating frequency of oscillator 56.

PLL circuit 55 including delay control line 3, select circuit 4, and phase comparator 5 shown in FIGS. 2–4 (referred to as PLL circuit 55.1 hereinafter) as delay control unit 57, select circuit 58, and phase comparator 59, or including delay control unit 6 and select circuit 7 shown in FIG. 7, and phase comparator 5 shown in FIG. 4 (referred to as PLL circuit 55.2) as delay control unit 57, select circuit 58, and phase comparator 59, respectively, allows an advantage similar to that of DLL circuits 1 and 8 to be obtained.

Figure 9:
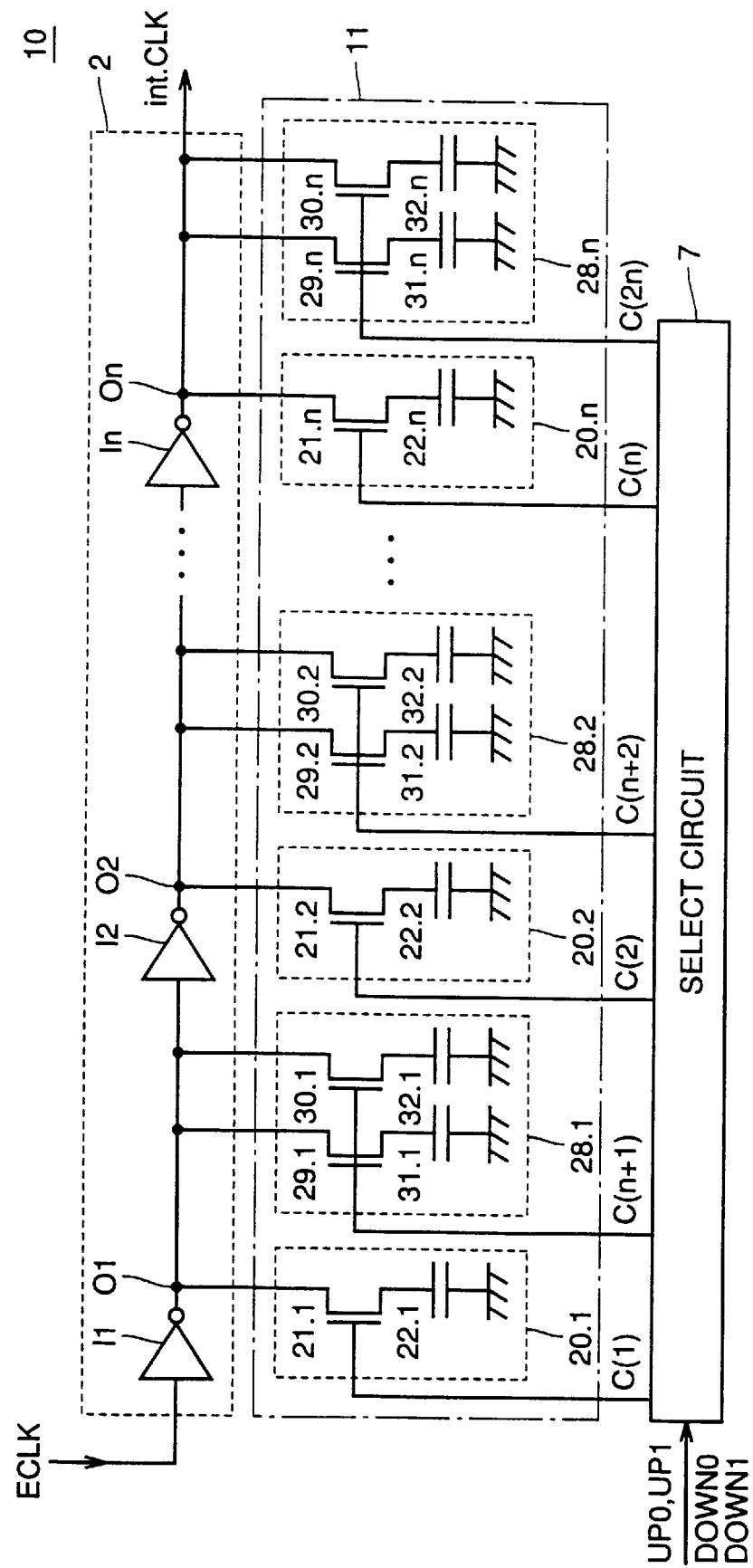
FIG. 9 is a circuit diagram showing a basic structure of the main components of a DLL circuit 10 according to the first embodiment of the present invention.

A further DLL circuit 10 according to the first embodiment of the present invention will be described hereinafter with reference to FIG. 9. A DLL circuit 10 of the present embodiment can have the capacitance of delay line 2 gradually increased according to the delay time. Referring to FIG. 9, a delay control unit 11 further includes a plurality of control circuits (28.1, 28.2, ..., 28.n) in addition to a plurality of control circuits (20.1, 20.2, ..., 20.n).

Respective control circuits (28.1, 28.2, ..., 28.n) are provided corresponding to respective inverter circuits (I1, I2, ..., In). Each control circuit (28.1, 28.2, ..., 28.n) includes an NMOS transistor (29.1, ..., 29.n), an NMOS transistor (30.1, ..., 30.n), a capacitor (31.1, ..., 31.n), and a capacitor (32.1, ..., 32.n).

The total capacitance of respective capacitors (31.1, 32.1), (31.2, 32.2), ..., and (31.n, ..., 32.n) is greater than the capacitance of the capacitor (20.1, ..., 20.n).

Each of NMOS transistors (29.1, 29.2, ..., 29.n) and each of NMOS transistors (30.1, 30.2, ..., 30.n) receive a control signal (C(n+1), C(n+2), ..., C(2n)) from select circuit 7.

The specific structure and operation of control circuit 28.1 will be described hereinafter. Control circuit 28.1 includes an NMOS transistor 29.1, an NMOS transistor 30.1, a capacitor 31.1, and a capacitor 32.1. Capacitors 31.1 and 32.1 have their one electrodes connected to ground potential Vss. NMOS transistor 29.1 is connected between output node O1 of inverter circuit I1 and the other electrode of capacitor 31.1. NMOS transistor 30.1 is connected between output node O1 of inverter circuit I1 and the other electrode of capacitor 32.1. NMOS transistors 29.1 and 30.1 receive a control signal C(n+1) from select circuit 7 at their gate electrodes. NMOS transistors 29.1 and 30.1 conduct upon receiving a control signal C (n+1) of an H level.

The operation of a control circuit (28.1, 28.2, . . . , 28.n) will be described briefly hereinafter. Each of NMOS transistors (29.1, 30.1), (29.2, 30.2), . . , (29.n, 30.n) is called a switch (29.1, 29.2, . . . , 29.n). The conducting/non-conducting state of each of NMOS transistors (29.1, 30.1), (29.2, 30.2), . . . , (29.n, 30.n) is referred to as the on/off state of a corresponding switch (29.1, 29.2, . . . , 29.n).

Each switch (29.1, 29.2, . . . , 29.n) is turned on/off according to a control signal (C(n+1), C(n+2), . . . , C(2n)) from select circuit 7. For example, when switch 29.1 is turned on, a corresponding output node O1 is electrically connected to capacitors 31.1 and 32.1. The potential of the output signal of the corresponding output node O1 is altered gently according to a value determined by the capacitance of capacitors 31.1 and 32.1. Since the capacitance of capacitors 31.1 and 32.1 is greater than that of capacitor 22.1, the transition speed of the potential is more gentle than the case where switch 21.1 is turned on. In other words, the varying step of the delay time can be increased by setting switches (29.1, 29.2, . . . , 29.n) to an on/off state.

The operation of DLL circuit 10 will be described hereinafter.

When the delay time required in delay line 2 is short, the delay time of delay line 2 is controlled by switches (21.1, 21.2, . . . , 21.n) according to control signals (C(1), C(2), . . . , C(n)).

When the delay time required in delay line 2 is long, the delay time is controlled by switches (29.1, 29.2, . . . , 29.n) with switches (21.1, 21.2, . . . , 21.n) turned on. In this case, the varying step of the delay time in delay line 2 is greater than the case where the required delay time is short.

According to the above structure, phase-synchronization with clock signal CLK having a greater operating frequency can be established in DLL circuit 10 according to the first embodiment of the present invention.

In the case where DLL circuit 10 is used as internal clock signal generation circuit 201 in SDRAM 200 shown in FIG. 16, the varying step of the delay time can be set more closely or more disperse when the operating frequency of external clock signal ext.CLK is high or low, respectively. As a result, a high speed access operation is allowed in SDRAM 200.

By providing delay control unit 11, select circuit 7 shown in FIG. 9 and phase comparator 5 shown in FIG. 4 as delay control unit 57, select circuit 58, and phase comparator 59, respectively, in PLL circuit 55 of FIG. 8 (referred to as PLL circuit 55.3 hereinafter), an advantage similar to that of DLL circuit 10 can be obtained.

The usage of the above PLL circuits 55.1–55.3 as internal clock signal generation circuit 201 in SDRAM 200 shown in FIG. 16 provides the advantage that a high speed access operation can be realized in SDRAM 200.

Second Embodiment

According to a second embodiment of the present invention, fine-adjustment of the variation of the delay time in a delay line is allowed by connecting a capacitor to the delay line and controlling the current flow to the capacitor in a digital manner in an internal clock signal generation circuit with a delay line.

A DLL circuit will be described hereinafter as a specific example. of an internal clock signal generation circuit according to the second embodiment of the present invention.

Figure 10:
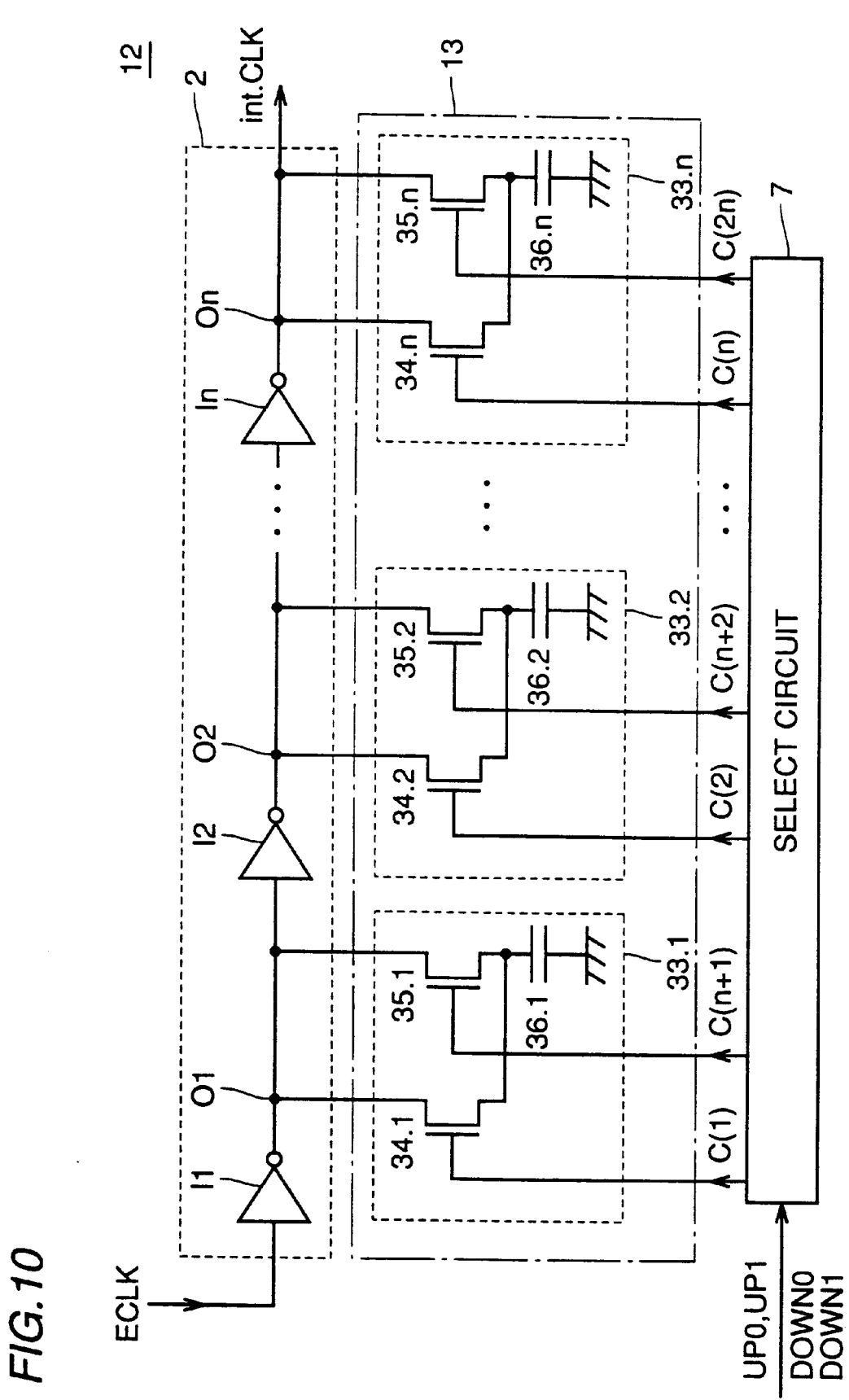
FIG. 10 is a circuit diagram showing a basic structure of the main components of a DLL circuit 12 according to a second embodiment of the present invention.

Referring to FIG. 10, a DLL circuit 12 of the second embodiment includes a delay control unit 13. Delay control unit 13 includes a plurality of control circuits (33.1, 33.2, . . . , 33.n). Each control circuit (33.1, 33.2, . . . , 33.n) is provided corresponding to each inverter circuit (I1, I2, . . . , In). Each control circuits (33.1, 33.2, . . . , 33.n) includes one NMOS transistor (34.1, . . . , 34.n), one NMOS transistor (35.1, . . . , 35.n), and one capacitor (36.1, . . . , 36.n).

The gate electrode of each of NMOS transistors (34.1, 34.2, . . . , 34.n) receives a control signal (C(1), C(2), . . . , C(n)) from select circuit 7. The gate electrode of each of NMOS transistors (35.1, 35.2, . . . , 35.n) receives a control signal (C(n+1), C(n+2), . . . , C(2n)) from select circuit 7.

The structure and operation of control circuit 33.1 will be described in detail hereinafter. Control circuit 33.1 includes an NMOS transistor 34.1, an NMOS transistor 35.1, and a capacitor 36.1. Capacitor 36.1 has one electrode connected to ground potential Vss. NMOS transistors 34.1 and 35.1 are connected between output node O1 of inverter circuit I1 and the other electrode of capacitors 36.1.

The gate electrode of NMOS transistor 34.1 receives a control signal C(1) from select circuit 7. The gate electrode of NMOS transistor 35.1 receives a control signal C(n+1) from select circuit 7. NMOS transistor 34.1 is rendered conductive upon receiving a control signal C(1) of an H level. NMOS transistor 35.1 is rendered conductive upon receiving a control signal C(n+1) of an H level.

The operation of control circuits (33.1, 33.2, . . . . 33.n) will be described briefly. Each of NMOS transistors (34.1, 34.2, . . . , 34.n) is rendered conductive/non-conductive according to a control signal (C(1), C(2), . . . , C(n)) from select circuit 7. For example, when NMOS transistor 34.1 attains a conductive state, a corresponding output node O1 is electrically connected to capacitor 36.1. Therefore, a current depending upon the current supply capability of NMOS transistor 34.1 is conducted to capacitor 36.1.

Respective NMOS transistors (35.1, 35.2, . . . , 35.n) attain a conductive state/non-conductive state according to a control signal (C(n+1), C(n+2), . . . , C(2n)) from select circuit 7. For example, when NMOS transistor 35.1 is rendered conductive, a corresponding output node O1 and capacitor 36.1 are electrically connected. Therefore, a current depending upon the current supply capability of NMOS transistor 35.1 is conducted to capacitor 36.1.

More specifically, the current flowing to capacitors (36.1, 36.2, . . . , 36.n) is altered by selectively rendering NMOS transistors (34.1, 34.2, . . . , 34.n) and NMOS transistors (35.1, 35.2, . . . , 35.n) conductive.

The operation of DLL circuit 12 will. be described hereinafter.

When the delay time required in delay line 2 is short, control signals (C(n+1), C(n+2), . . . , C(2n)) attain an inactive state, and control signals (C(1), C(2), . . . , C(n)) is rendered active/inactive. The delay time of delay line 2 is controlled by the current supply capability of NMOS transistors (34.1, 34.2, . . . , 34.n).

When the delay time required in delay line 2 is long, control signals (C(1), C(2), . . . , C(n)) attain an active state, and control signals (C(n+1), C(n+2), ..., C(2n)) are rendered active/inactive. The delay time of delay line 2 is controlled by the current supply capability of NMOS transistors (34.1, 34.2, ..., 34.n) and NMOS transistors (35.1, 35.2, ..., 35.n).

By the above structure, DLL circuit 12 according to the second embodiment of the present invention allows phase-synchronization with clock signal CLK having a greater operating frequency established.

In the case where DLL circuit 12 is used as internal clock signal generation circuit 201 in SDRAM 200 of FIG. 16, the varying step of the delay time can be made more minute or more disperse when external clock signal ext.CLK has a high operating frequency or a low operating frequency, respectively. As a result, a high speed access operation can be realized in SDRAM 200.

By providing delay control unit 13, select circuit 7, and phase comparator 5 as delay control unit 57, select circuit 58, and phase comparator 59, respectively, in PLL circuit 55 of FIG. 8 (referred to as PLL circuit 55.4 hereinafter), an advantage similar to that of DLL circuit 12 can be obtained.

The usage of the above PLL circuit 55.4 as internal clock signal generation circuit 201 in SDRAM 200 of FIG. 16 provides the advantage of a high speed access operation in SDRAM 20.

Third Embodiment

According to a third embodiment of the present invention, an internal clock signal generation circuit with a delay line can have the sensitivity of the phase comparator altered according to the operating frequency of an input signal.

A DLL circuit will be described hereinafter as a specific example of an internal clock signal generation circuit according to a third embodiment of the present invention.

Figure 11:
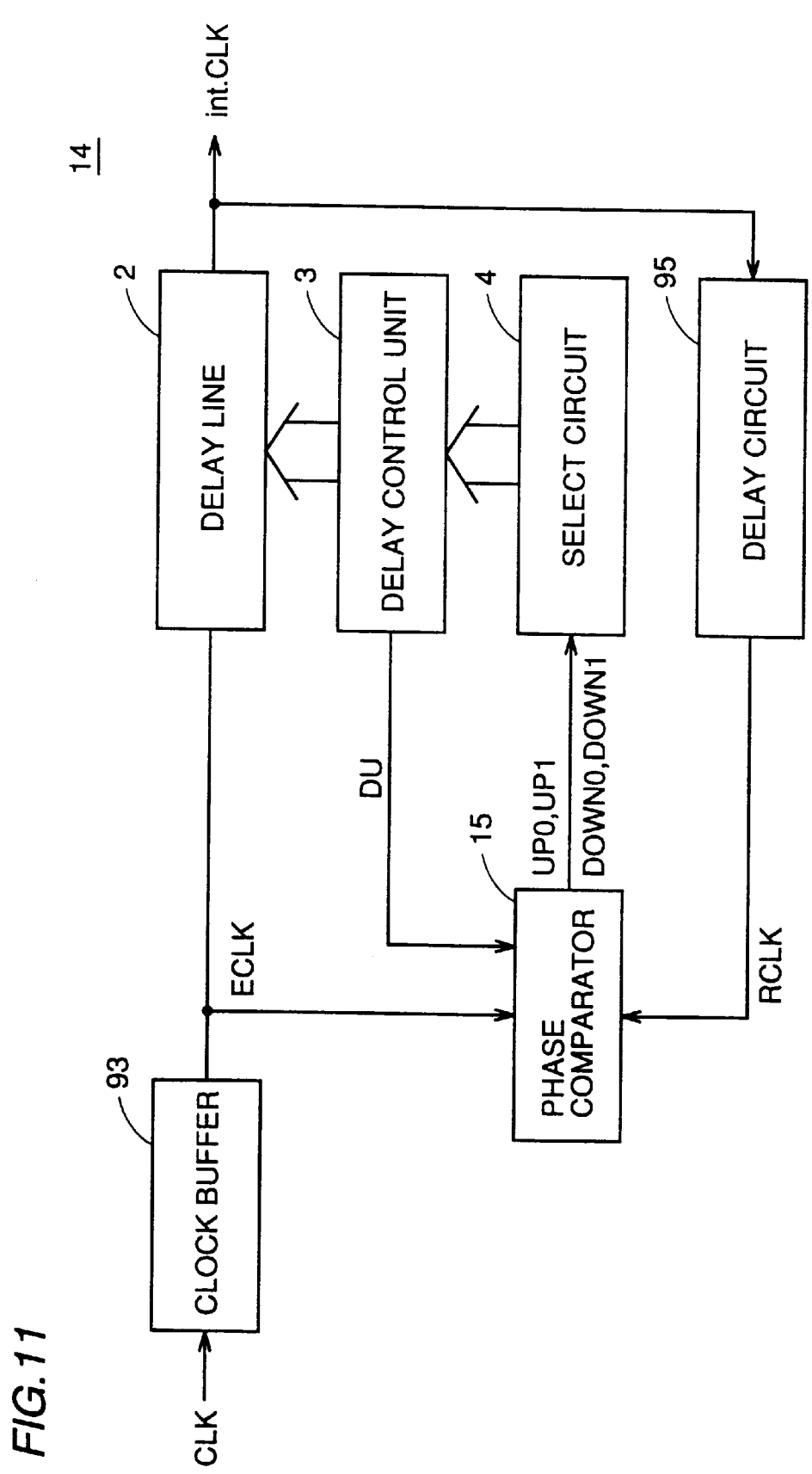
FIG. 11 is a circuit diagram showing a basic structure of the main components of a DLL circuit 14 according to a third embodiment of the present invention.

A DLL circuit 14 of the third embodiment shown in FIG. 11 differs from DLL circuits 1, 8, 10, and 12 of the first and second embodiments in that a phase comparator 15 is provided instead of phase comparator 5. Phase comparator 15 can alter the sensitivity of the phase comparator according to the level of the operating frequency of an input signal.

Figure 12:
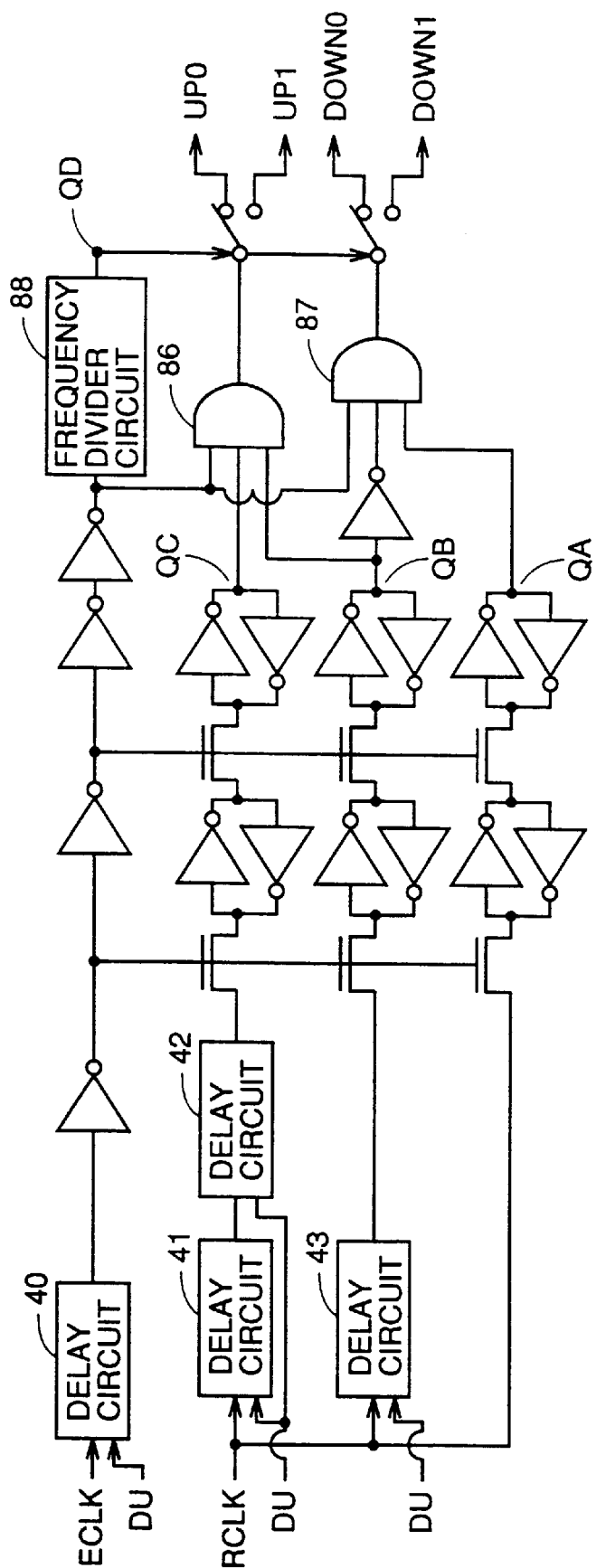
FIG. 12 is a circuit diagram showing a basic structure of the main components of a phase comparator 15 according to the third embodiment of the present invention.

Phase comparator 15 will be described hereinafter with reference to FIGS. 11 and 12. Phase comparator 15 includes delay circuits 40, 41, 42 and 43. Delay circuit 40 receives the input of a clock signal ECLK and a signal DU. Delay circuit 41 receives the input of a clock signal RCLK and a signal DU. Delay circuit 42 connected to delay circuit 41 receives the output of delay circuit 41 and an input of signal DU. Delay circuit 43 receives the input of clock signal RCLK and signal DU.

Here, signal DU is one of the control signals (C(1), C(2), ..., C(n)) output from select circuit 4 of FIG. 11.

Figure 13:
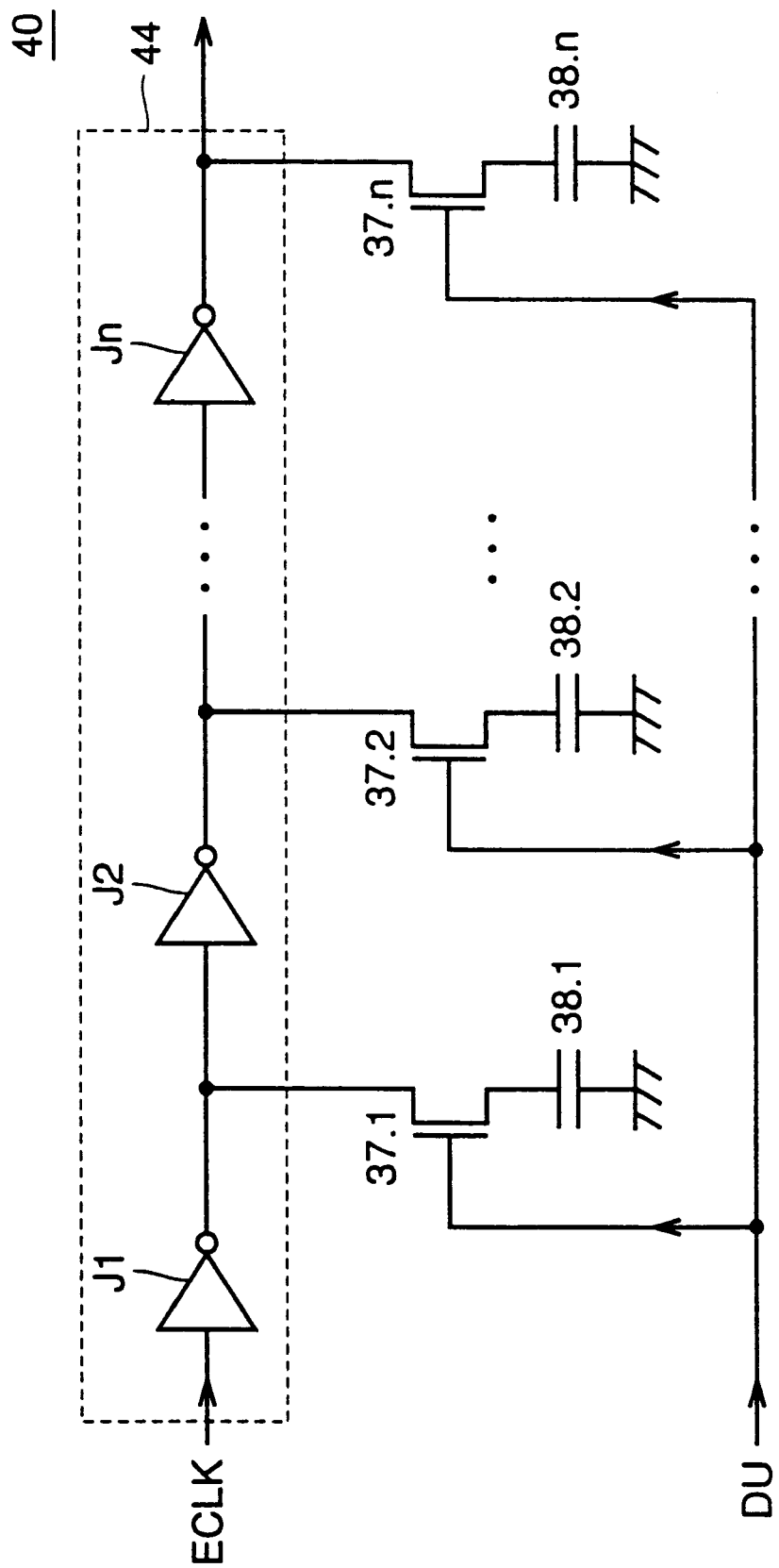
FIG. 13 shows a basic structure of the main components of a delay circuit 40 forming phase comparator 15 according to the third embodiment of the present invention.

Delay circuit 40 forming phase comparator 15 of the third embodiment will be described hereinafter. Referring to FIG. 13, delay circuit 40 includes a delay line 44 formed of a plurality of inverter circuits (J1, ..., Jn). NMOS transistors (37.1, 37.2, ..., 37.n) and capacitors (38.1, 38.2, ..., 38.n) are connected in series with the output node of inverter circuits (J1, J2, ..., Jn). Each NMOS transistor (37.1, 37.2, ..., 37.n) receives signal DU.

The operation of delay circuit 40 will be described hereinafter. Delay circuit 40 delays clock signal ECLK and outputs the delayed signal. In response to receiving signal DU, NMOS transistors (37.1, 37.2, ..., 37.n) are rendered conductive, whereby delay line 44 and capacitors (38.1, 38.2, ..., 38.n) are connected. As a result, the delay time of delay line 44 is increased. Delay circuits 41, 42, and 43 have a structure similar to that of delay circuit 40. Delay circuits 41, 42 and 43 receive signal DU to have the delay time increased. As a result, the dead zone H is increased.

More specifically, phase comparator 15 allows dead zone H to be increased according to the number of activated control signals (C(1), C(2), ..., C(n)). Here, the number of activating control signals (C(1), C(2), ..., C(n)) represents the high or low level of the operating frequency of clock signal CLK input to DLL circuit 14.

In the case where DLL circuit 14 is used as internal clock signal generation circuit 201 in SDRAM 200 of FIG. 16, the dead zone H can be reduced when the operating frequency of external clock signal ext.CLK is high (in this case, output signal DU attains an L level), and when a high accuracy of phase synchronization is required. When the external clock signal ext.CLK has a low operating frequency (in this case, output signal DU attains an H level), and high accuracy is not required, dead zone H can be increased.

As a result, when the operating frequency is low and high accuracy is not required, the number of operations of select circuit 4 shown in FIG. 11 can be reduced to lower the power consumption of SDRAM 200 of FIG. 16. This is also applicable in a PLL circuit.

Fourth Embodiment

According to a fourth embodiment of the present invention, an internal clock signal generation circuit with a delay line can have the varying step of the delay time adjusted minutely by altering the apparent capacitance of the delay line in a digital manner.

A DLL circuit will be described hereinafter as a specific example of an internal clock signal generation circuit of the fourth embodiment.

Figure 14:
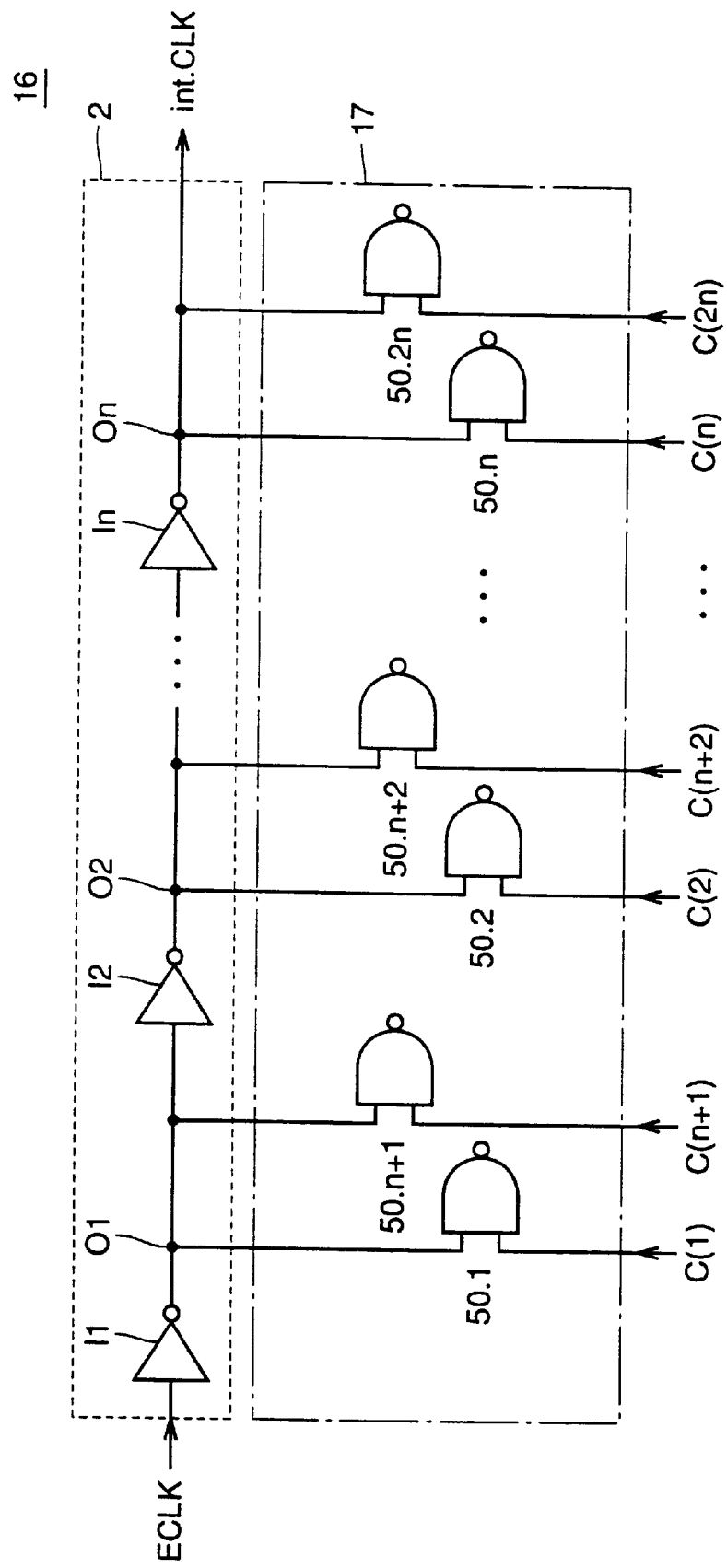
FIG. 14 is a circuit diagram showing a basic structure of the main components of a DLL circuit 16 according to a fourth embodiment of the present invention.

A DLL circuit 16 of the fourth embodiment shown in FIG. 14 differs from DLL circuit 1 of the first embodiment shown in FIGS. 1 and 2 in that a delay control unit 17 that controls the delay by the apparent capacitance according to the Miller effect is provided instead of delay control unit 3 including a capacitor.

The Miller effect is disclosed in details in "CMOS DIGITAL CIRCUIT TECHNOLOGY" by Masakazu Shoji (AT&T), PRENTICE HALL, Englewood Cliffs, N.J. 07632, pp.177–188. Therefore, a description of the Miller effect will not be provided herein.

DLL circuit 16 according to the fourth embodiment of the present invention will be described with reference to FIG. 14.

A delay control unit 17 includes a plurality of NAND circuits (50.1, 50.2, ..., 50.2n). Respective NAND circuits (50.1, 50.n+1), (50.2, 50.n+2), ..., (50.n, 50.2n) are provided corresponding to respective inverter circuits (I1, I2, ..., In). Each of NAND circuits (50.1, 50.2, ..., 50.2n) has one input terminal connected to a corresponding output node (O1, O2, ..., On). The other input terminal of each of NAND circuits (50.1, 50.2, ..., 50.2n) receives a control signal (C(1), C(2), ..., C(2n)) from select circuit 7.

A NAND circuit 50.1 will be described specifically hereinafter. When a control signal C(1) of an H level is applied to one input terminal of NAND circuit 51.1, an apparent capacitance is generated at the other input terminal by the Miller effect. As a result, a state is established where an apparent capacitor is connected to a corresponding output node O1. Therefore, the potential of the output signal of output node O1 shows a mild transition by the apparent capacitance.

Another DLL circuit 18 of the fourth embodiment of the present invention employing the Miller effect will be described with reference to FIG. 15. A delay control unit 19 in DLL circuit 18 includes a plurality of capacitors (52.1, 52.2, ..., 52.2n), and NMOS transistors (51.1, 51.2, ..., 51.2n) connected to respective capacitors (52.1., 52.2, ..., 52.2n). The gate electrode of each of NMOS transistors (51.1., 51.2, ..., 51.2n) receives a control signal (C(1), C(2), ..., C(2n)).

When a control signal (C(1), C(2), ...., C(2n)) of an H level is applied to each of NMOS transistors (51.1, 51.2, ..., 51.2n), an apparent capacitance is generated between capacitors (52.1, 52.2, ..., 52.2n) and NMOS transistors (51.1, 51.2, ..., 51.2n) by the Miller effect.

Figure 15:
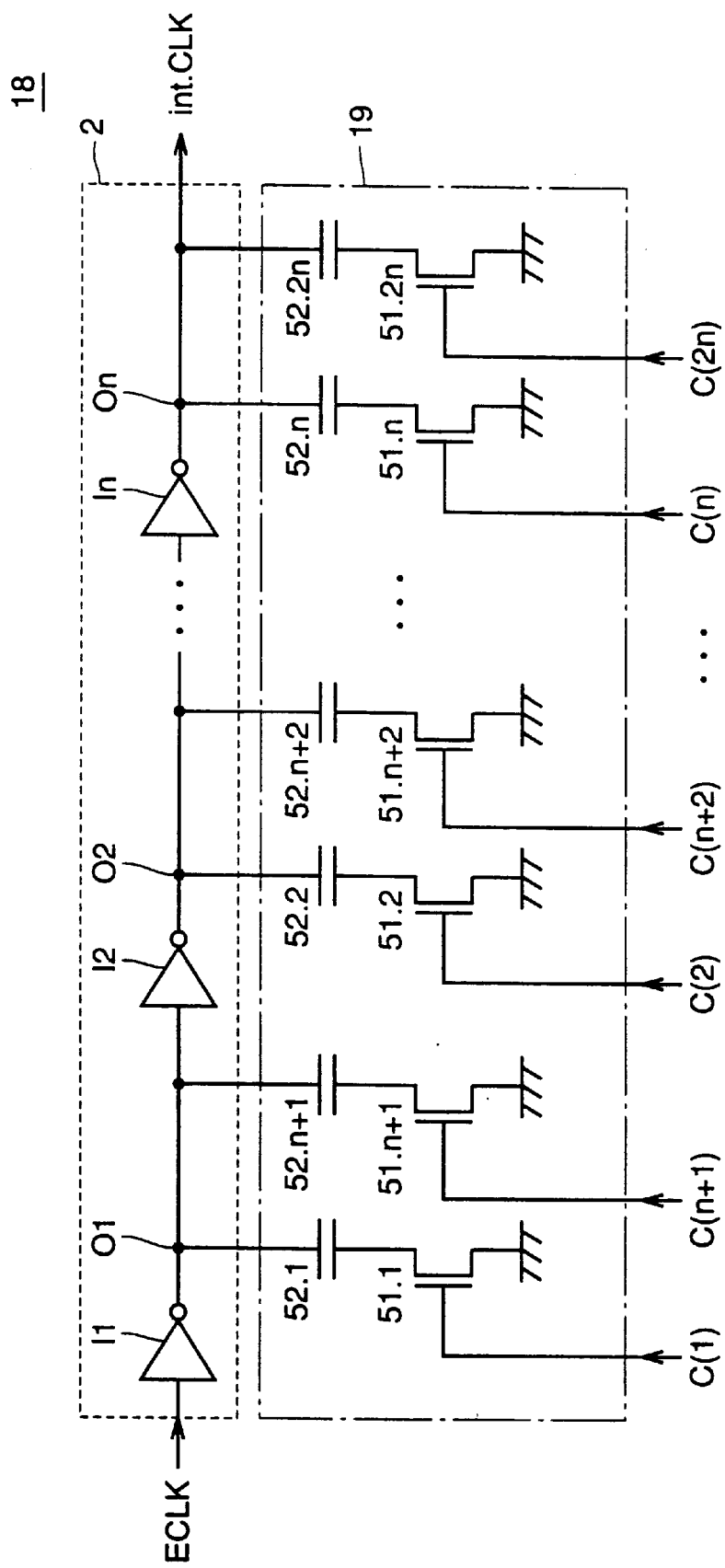
FIG. 15 is a circuit diagram showing a basic structure of the main components of a DLL circuit 18 according to a fourth embodiment of the present invention.

By the structure as shown in FIGS. 14 and 15, fine adjustment of the delay time of delay line 2 is allowed according to the Miller effect.

The same is also applicable to a PLL circuit. The usage of DLL circuits 16 and 18 as internal clock signal generation circuit 201 in SDRAM 200 of FIG. 16 allows a high speed access operation in SDRAM 200.

According to an internal clock signal generation circuit of the present invention, the varying step of the delay time can be adjusted minutely according to the phase difference between an external clock signal and an internal clock signal. Therefore, an internal clock signal synchronizing in phase efficiently and at high accuracy can be generated over a wide range of frequencies.

According to an internal clock signal generation circuit of the present invention, the varying step of a delay time can be adjusted minutely according to the phase difference between an external clock signal and an internal clock signal. Therefore, an internal clock signal synchronizing in phase and in frequency can be generated efficiently and at high accuracy over a wide range of frequencies.

According to a synchronous type semiconductor memory device of the present invention, a high speed access operation can be realized by incorporating an internal clock signal generation circuit that can generate an internal clock signal synchronizing in phase efficiently and at high accuracy over a wide range of frequencies.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal clock signal generation circuit for generating an internal clock signal synchronizing in phase with an external clock signal, comprising:
   a delay line for delaying said external clock signal and providing said internal clock signal, said delay line including a plural number of delay elements connected in series;
   a phase detection circuit for detecting a phase difference between said external clock signal and said internal clock signal to determine a delay time required to delay said external clock signal; and
   a delay control circuit, including a plural number of capacitance circuits coupled to outputs of the plural number of said delay elements in parallel, each of said plural number of capacitance circuits controlling a delay of a corresponding delay element in response to a detected result of said phase detection circuit.

2. The internal clock signal generation circuit according to claim 1,
   said plural number of capacitance circuits of said delay control circuit including:
   a plurality of first capacitor elements provided corresponding to respective output nodes of said plural number of delay elements, and
   a plurality of first switches connected between said plurality of first capacitor elements and said output nodes, respectively,
   each said first switch establishing a connected state/non-connected state between a corresponding said first capacitor element and a corresponding said output node individually by switching between an on state and an off state according to a detected result of the phase difference of said phase detection circuit.

3. The internal clock signal generation circuit according to claim 1,
   said plural number of capacitance circuits of said delay control circuit including:
   a plurality of second capacitor elements provided corresponding to respective output nodes of said plural number of delay elements,
   a plurality of third capacitor elements provided corresponding to respective output nodes of said plural number of delay elements, each having a capacitance greater than the capacitance of each of said plurality of second capacitor elements,
   a plurality of second switches each for establishing a connected state/non-connected state between a corresponding said second capacitor element and a corresponding said output node by switching between an on state and an off state according to a detected result of the phase difference of said phase detection circuit, and
   a plurality of third switches each for establishing a connected state/non-connected state between a corresponding said third capacitor element and a corresponding said output node by switching between an on state and an off state according to a detected result of the phase difference of said phase detection circuit,
   said plurality of second switches being selectively turned on when the delay time required to delay said external clock signal is relatively short, and said plurality of second switches being turned on and said plurality of third switches being selectively turned on when the delay time required to delay said external clock signal is relatively long.

4. The internal clock signal generation circuit according to claim 1,
   said plural number of capacitance circuits of said delay control circuit including:
   a plurality of fourth capacitor elements provided corresponding to respective output nodes of said plural number of delay elements, and
   a plurality of current adjust circuits, connected between said plurality of fourth capacitor elements and said output nodes, respectively,
   each said current adjust circuit adjusting a value of a current flowing from a corresponding said output node to a corresponding said fourth capacitor element according to a detected result of the phase difference of said phase detection circuit.

5. The internal clock signal generation circuit according to claim 1,
   said plural number of capacitance circuits of said delay control circuit including a plurality of apparent capacitor elements provided corresponding to respective output nodes of said plural number of delay elements, said plurality of apparent capacitor elements each generating an apparent capacitance on a corresponding output node under control of said phase control circuit.

6. The internal clock signal generation circuit according to claim 1, said phase detection circuit including:
a first delay circuit for delaying said external clock signal,
a second delay circuit for delaying said internal clock signal, and
a comparator for comparing a phase difference between an output of said first delay circuit and an output of said second delay circuit,
sensitivity of said phase comparator being degraded by increasing the delay time of said first delay circuit and the delay time of the second delay circuit when the delay time required to delay said external clock signal is relatively long.

7. An internal clock signal generation circuit for generating an internal clock signal synchronizing in phase and in frequency with said an external clock signal, comprising:

an oscillation circuit including a delay line determining an oscillating frequency of said internal clock signal, said delay line including a plural number of delay elements connected in series;
a phase detection circuit for detecting a phase difference between said external clock signal and said internal clock signal output from said oscillation circuit to determine a delay time required to delay said external clock signal; and
a delay control circuit including a plural number of capacitance circuits coupled to outputs of the plural number of said delay elements in parallel each of said plural number of capacitance circuits controlling a delay of a corresponding delay element in response to a detected result of said phase detection circuit.

8. The internal clock signal generation circuit according to claim 7, said plural number of capacitance circuits of said delay control circuit including:
a plurality of first capacitor elements provided corresponding to respective output nodes of said plural number of delay elements, and
a plurality of first switches connected between said plurality of first capacitor elements and said output nodes, respectively,
each said first switch establishing a connected state/non-connected state between a corresponding said first capacitor element and a corresponding said output node individually by switching between an on state and an off state according to a detected result of the phase difference from said phase detection circuit.

9. The internal clock signal generation circuit according to claim 7, said plural number of capacitance circuits of said delay control circuit including:
a plurality of second capacitor elements provided corresponding to respective output nodes of said plural number of delay elements,
a plurality of third capacitor elements provided corresponding to respective output nodes of said plural number of delay elements, each having a capacitance greater than the capacitance of each of said plurality of second capacitor elements, a plurality of second switches each for establishing a connected state/non-connected state between a corresponding said second capacitor elements and a corresponding said output node by switching between an on state and an off state according to a detected result of the phase difference from said phase detection circuit,
a plurality of third switches each for establishing a connected state/non-connected state between a corresponding said plurality of third capacitor elements and a corresponding said output node by switching between an on state and an off state according to a detected result of the phase difference of said phase detection circuit,
said plurality of second switches being selectively turned on when the delay time required to delay said external clock signal is relatively short, and said plurality of second switches being turned on and said plurality of third switches being selectively turned on when the delay time required to delay said external clock signal is relatively long.

10. The internal clock signal generation circuit according to claim 7, wherein said plural number of capacitance circuits of said delay control circuit including
a plurality of fourth capacitor elements provided corresponding to respective output nodes of said plural number of delay elements, and
a plurality of current adjust circuits connected between said plurality of fourth capacitor elements and said output nodes, respectively,
each said current adjust circuit adjusting value of a current flowing from a corresponding said output node to a corresponding said fourth capacitor element according to a detected result of the phase difference of said phase detection circuit.

11. The internal clock signal generation circuit according to claim 7, said plural number of capacitance circuits of said delay control circuit including a plurality of apparent capacitor elements provided corresponding to respective output nodes of said plural number of delay elements,
said plurality of apparent capacitor elements each generating an apparent capacitance on a corresponding output node under control of said phase control circuit.

12. The internal clock signal generation circuit according to claim 7, said phase detection circuit including
a first delay circuit for delaying said external clock signal,
a second delay circuit for delaying said internal clock signal, and
a comparator for comparing a phase difference between an output of said first delay circuit and an output of said second delay circuit,
sensitivity of said phase comparator being degraded by increasing the delay time of said first delay circuit and the delay time of said second delay circuit when the delay time required to delay said external clock signal is long.

13. A synchronous semiconductor memory device for entering an external signal including a control signal, an address signal, and an input signal in synchronization with an external clock signal, comprising:

a memory array including a plurality of memory cells arranged in a matrix in row and column directions;

internal clock generation circuit for providing an internal clock signal synchronizing in phase with said external clock signal; and data input/output circuit for selecting said memory cell to carry out data writing and reading with respect to said selected memory cell in synchronization with said internal clock signal, said internal clock signal generation circuit including:
- a delay line for delaying said external clock signal and providing said internal clock signal, said delay line including a plural number of delay elements connected in series,
- a phase detection circuit for detecting a phase difference between said external clock signal and said internal clock signal to determine a delay time required to delay said external clock signal, and
- a delay control circuit including a plural number of capacitance circuits coupled to outputs of the plural number of said delay elements in parallel, each of said plural number of capacitance circuits controlling a delay of a corresponding delay element in response to a detected result of said phase detection circuit.

14. The synchronous type semiconductor memory device according to claim 13, said plural number of capacitance circuits of said delay control circuit including:
- a plurality of first capacitor elements, provided corresponding to respective output nodes of said plural number of delay elements,
- a plurality of first switches connected between said plurality of first capacitor elements and said output nodes, respectively,
- each said first switch establishing a connected state/non-connected state between a corresponding said first capacitor element and a corresponding said output node individually by switching between an on state and an off state according to a detected result of the phase difference from said phase detection circuit.

* * * * *

UNITED STATES PATENT AND TRADEMARK OFFICE
CERTIFICATE OF CORRECTION

PATENT NO.    : 5,946,268
DATED         : August 31, 1999
INVENTOR(S)   : Hisashi Iwamoto, et al.

It is certified that error appears in the above-identified patent and that said Letters Patent is hereby corrected as shown below:

Column 15, claim 1,
Line 54, replace "plural number" with -- plurality --
Line 61, replace "outputs" with -- output nodes --

Column 16, claim 2,
Line 2, after "claim 1," insert -- wherein --
Line 4, replace "including" with -- include --
Line 6, replace "said" with -- the --
Line 7, after "of" insert -- said --
Line 15, replace "a" with -- the -- and delete "of"
Line 16, delete "the phase difference"

Column 16, claim 3,
Line 18, after "claim 1," insert -- wherein --
Line 20, replace "including" with -- include --
Line 21, replace "second" with -- first --
Line 22, replace "said" with -- the --
Line 23, after "of" insert -- said --
Line 24, replace "third" with -- second --
Line 25, replace "said" with -- the --
Line 26, after "of" insert -- said --
Line 28, replace "second" with -- first --
Line 29, replace "second" with -- first --
Line 31, replace "said second" with -- first --
Line 32, delete "said"
Line 33, replace "a" with -- the --
Line 34, delete "of the phase difference"
Line 36, replace "third" with -- second --
Line 38, replace "said third" with -- second --
Line 39, delete "said"
Line 40, replace "a" with -- the --
Line 41, delete "of the phase difference"
Line 43, replace "second" with -- first --
Line 46, replace "second" with -- first --
Line 47, replace "third" with -- second --

Column 16, claim 4,
Line 51, after "claim 1," insert -- wherein --
Line 53, replace "including" with -- include --
Line 54, replace "fourth" with -- first --

UNITED STATES PATENT AND TRADEMARK OFFICE
CERTIFICATE OF CORRECTION

PATENT NO. : 5,946,268
DATED : August 31, 1999
INVENTOR(S) : Hisashi Iwamoto, et al.

It is certified that error appears in the above-identified patent and that said Letters Patent is hereby corrected as shown below:

Column 16, claim 4,
Line 55, replace "said" with -- the --
Line 56, after "of" insert -- said --
Line 58, replace "fourth" with -- first --
Line 61, delete "said"
Line 62, replace "said fourth" with -- first --
Line 63, replace "a" with -- the --
Line 63, delete "of the phase"
Line 64, delete "difference"

Column 16, claim 5,
Line 66, after "claim 1," insert -- wherein --
Line 68, replace "including" with -- include --

Column 17, claim 5,
Line 2, replace "said" with -- the --
Line 2, after "of" insert -- said --
Line 5, replace "control" with -- detection --

Column 17, claim 6,
Line 7, after "claim 1," insert -- wherein --
Line 8, replace "including" with -- includes --
Line 16, delete "phase"

Column 17, claim 7,
Line 23, delete "said"
Line 26, replace "plural number" with -- plurality --
Line 31, replace "external" with -- internal --
Line 34, replace "outputs" with -- output nodes --

Column 17, claim 8,
Line 40, after "claim 7," insert -- wherein --
Line 42, replace "including" with -- include --
Line 44, replace "said" with -- the --
Line 45, after "of" insert -- said --
Line 53, replace "a" with -- the -- and delete "of"
Line 54, delete "the phase difference"

Column 17, claim 9,
Line 57, after "claim 7," insert -- wherein --
Line 59, replace "including" with -- include --

UNITED STATES PATENT AND TRADEMARK OFFICE
CERTIFICATE OF CORRECTION

PATENT NO. : 5,946,268
DATED : August 31, 1999
INVENTOR(S) : Hisashi Iwamoto, et al.

It is certified that error appears in the above-identified patent and that said Letters Patent is hereby corrected as shown below:

Column 17, claim 9,
Line 60, replace "second" with -- first --
Line 61, replace "said" with -- the --
Line 62, after "of" insert -- said --
Line 63, replace "third" with -- second --
Line 64, replace "said" with -- the --
Line 65, after "of" insert -- said --
Line 67, replace "second" with -- first --

Column 18, claim 9,
Line 1, replace "second" with -- first --
Line 3, replace "said second" with -- first --
Line 3, replace "elements" with -- element --
Line 4, delete "said"
Line 5, replace "a" with -- the --
Line 6, delete "of the phase difference"
Line 8, replace "third" with -- second --
Line 10, replace "said plurality of third" with -- second --
Line 10, replace "elements" with -- element --
Line 11, delete "said"
Line 12, replace "a" with -- the --
Line 13, delete "of the phase difference"
Line 15, replace "second" with -- first --
Line 17, replace "external" with -- internal --
Line 18, replace "second" with -- first --
Line 19, replace "third" with -- second --
Line 20, replace "external" with -- internal --

Column 18, claim 10,
Line 25, replace "including" with -- include --
Line 26, replace "fourth" with -- first --
Line 27, replace "said" with -- the --
Line 28, after "of" insert -- said --
Line 30, replace "fourth" with -- first --
Line 33, delete "said"
Line 34, replace "said fourth" with -- first --
Line 35, replace "a" with -- the --
Line 35, delete "of the phase"
Line 36, delete "difference"

Column 18, claim 11,
Line 38, after "claim 7," insert -- wherein --

UNITED STATES PATENT AND TRADEMARK OFFICE
CERTIFICATE OF CORRECTION

PATENT NO.   : 5,946,268
DATED        : August 31, 1999
INVENTOR(S)  : Hisashi Iwamoto, et al.

It is certified that error appears in the above-identified patent and that said Letters Patent is hereby corrected as shown below:

Column 18, claim 11,
Line 40, replace "including" with -- include --
Line 42, replace "said" with -- the --
Line 42, after "of" insert -- said --
Line 45, replace "control" with -- detection --

Column 18, claim 12,
Line 47, after "claim 7," insert -- wherein --
Line 48, replace "including" with -- include --
Line 56, delete "phase"
Line 59, replace "external" with -- internal --

Column 19, claim 13,
Line 1, after "clock" insert -- signal --
Line 11, replace "plural number" with -- plurality --
Line 18, replace "outputs" with -- output nodes --

Column 20, claim 14,
Line 1, delete "type"
Line 2, after "claim 13," insert -- wherein --
Line 4, replace "including" with -- include --
Line 6, replace "said" with -- the --
Line 7, after "of" insert -- said --
Line 15, replace "a" with -- the --
Line 15, delete "of"
Line 16, delete "the phase difference"

Signed and Sealed this

Twenty-third Day of October, 2001

*Attest:*

*Attesting Officer*

NICHOLAS P. GODICI
*Acting Director of the United States Patent and Trademark Office*